(12) United States Patent
Maniwa et al.

(10) Patent No.: US 11,877,394 B2
(45) Date of Patent: Jan. 16, 2024

(54) GLASS CORE MULTILAYER WIRING BOARD AND METHOD OF PRODUCING THE SAME

(71) Applicant: TOPPAN INC., Tokyo (JP)

(72) Inventors: Susumu Maniwa, Tokyo (JP); Masashi Sawadaishi, Tokyo (JP)

(73) Assignee: TOPPAN INC., Tokyo (JP)

( * ) Notice: Subject to any disclaimer, the term of this patent is extended or adjusted under 35 U.S.C. 154(b) by 5 days.

(21) Appl. No.: 17/746,018

(22) Filed: May 17, 2022

(65) Prior Publication Data

US 2022/0279651 A1 Sep. 1, 2022

Related U.S. Application Data

(63) Continuation of application No. PCT/JP2020/042767, filed on Nov. 17, 2020.

(30) Foreign Application Priority Data

Nov. 18, 2019 (JP) ................................. 2019-208248

(51) Int. Cl.
*H05K 1/03* (2006.01)
*H05K 1/11* (2006.01)
(Continued)

(52) U.S. Cl.
CPC ........... *H05K 1/0306* (2013.01); *H05K 1/115* (2013.01); *H05K 3/429* (2013.01); *H05K 3/4661* (2013.01);
(Continued)

(58) Field of Classification Search
CPC ...... H05K 1/0306; H05K 1/115; H05K 1/165; H05K 1/162; H05K 3/002; H05K 3/4605;
(Continued)

(56) References Cited

U.S. PATENT DOCUMENTS

| 6,404,615 B1 * | 6/2002 | Wijeyesekera | ......... H01L 28/40 361/312 |
| 2006/0081397 A1 | 4/2006 | Enchi et al. | |

(Continued)

FOREIGN PATENT DOCUMENTS

| EP | 1 139 705 A1 | 10/2001 |
| GB | 2 285 174 A | 6/1995 |

(Continued)

OTHER PUBLICATIONS

Extended European Search Report issued in corresponding European Patent Application No. 20891221.2, dated Feb. 9, 2023.
(Continued)

*Primary Examiner* — Timothy J Thompson
*Assistant Examiner* — John B Freal
(74) *Attorney, Agent, or Firm* — Foley & Lardner LLP

(57) ABSTRACT

A glass core multilayer wiring board includes a glass substrate, a through electrode, a first layer structure, and a second layer structure. A through hole has a diameter decreasing from a first surface toward a second surface. The through electrode is along a side wall of the through hole. The first layer structure is on the first surface and the second layer structure is on the second surface. The second layer structure closes an opening in the second surface defining a bottom section. The through electrode has: a first layer on part of the side wall and on part or all of the bottom section of the through hole closing the opening of the through hole, a second layer covering the first layer, the side wall of the through hole exposed, and the bottom section, and a third layer is located on the second layer.

16 Claims, 41 Drawing Sheets

(51) Int. Cl.
*H05K 3/42* (2006.01)
*H05K 3/46* (2006.01)

(52) U.S. Cl.
CPC .............. *H05K 2201/1003* (2013.01); *H05K 2201/10015* (2013.01)

(58) Field of Classification Search
CPC .............. H05K 3/429; H05K 3/4661; H05K 2201/10015; H05K 2201/1003; H01L 28/10; H01L 28/40
See application file for complete search history.

(56) References Cited

U.S. PATENT DOCUMENTS

| | | | |
|---|---|---|---|
| 2007/0246252 A1* | 10/2007 | Buchwalter | H05K 1/0298 29/830 |
| 2011/0192637 A1 | 8/2011 | Asai et al. | |
| 2014/0144681 A1* | 5/2014 | Pushparaj | C03C 17/3671 428/164 |
| 2015/0062851 A1* | 3/2015 | Shimizu | H05K 1/115 361/767 |
| 2016/0351321 A1 | 12/2016 | Lyoo et al. | |
| 2020/0275548 A1 | 8/2020 | Imayoshi | |
| 2020/0275558 A1 | 8/2020 | Fujita | |

FOREIGN PATENT DOCUMENTS

| | | |
|---|---|---|
| JP | 7-193214 A | 7/1995 |
| JP | 2004-47667 A | 2/2004 |
| JP | 2005-268447 A | 9/2005 |
| JP | 2017-005205 A | 1/2017 |
| JP | 2018-078133 A | 5/2018 |
| JP | 2019-102733 A | 6/2019 |
| WO | WO-2019/117073 A1 | 6/2019 |

OTHER PUBLICATIONS

International Searching Authority, "International Search Report," issued in connection with International Patent Application No. PCT/JP2020/042767, dated Feb. 16, 2021, 5 pages.

International Searching Authority, "Written Opinion," issued in connection with International Patent Application No. PCT/JP2020/042767, dated Feb. 16, 2021, 4 pages.

Office Action issued in corresponding Chinese Patent Application No. 202080078469.0, dated Jul. 26, 2023.

* cited by examiner

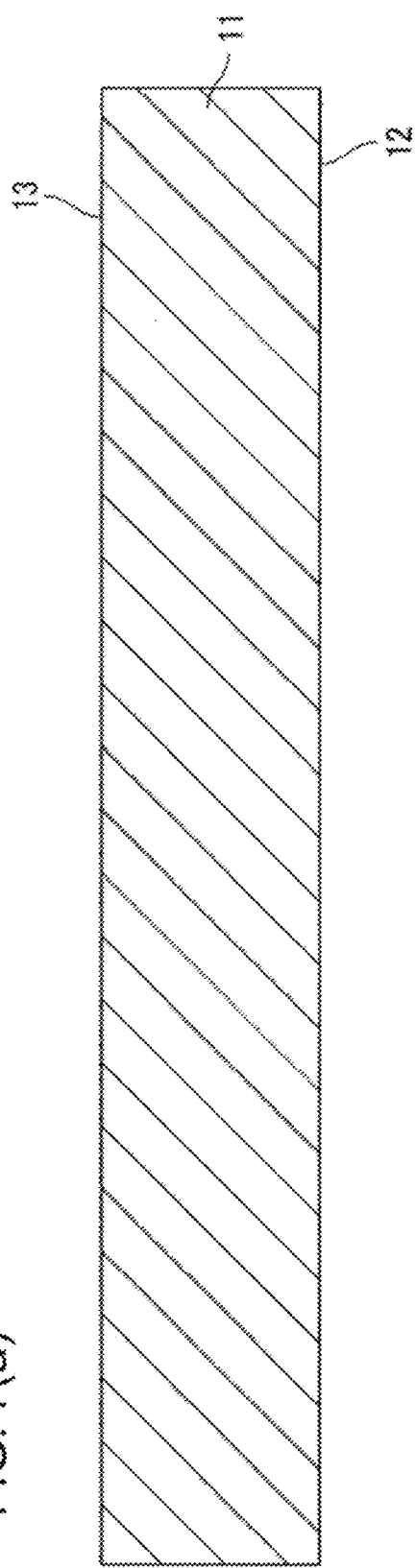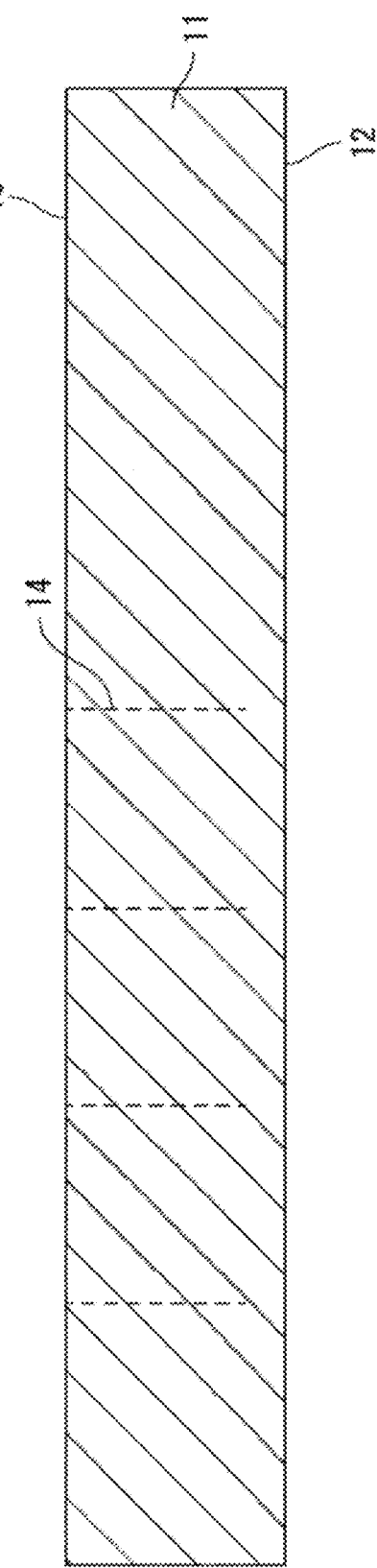

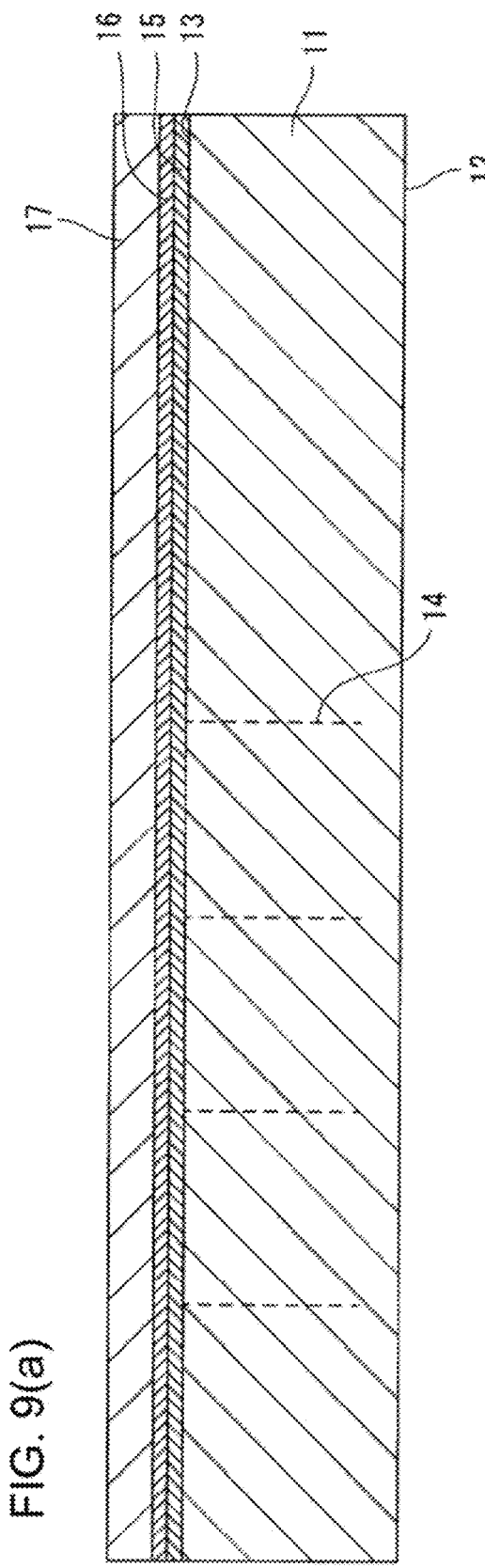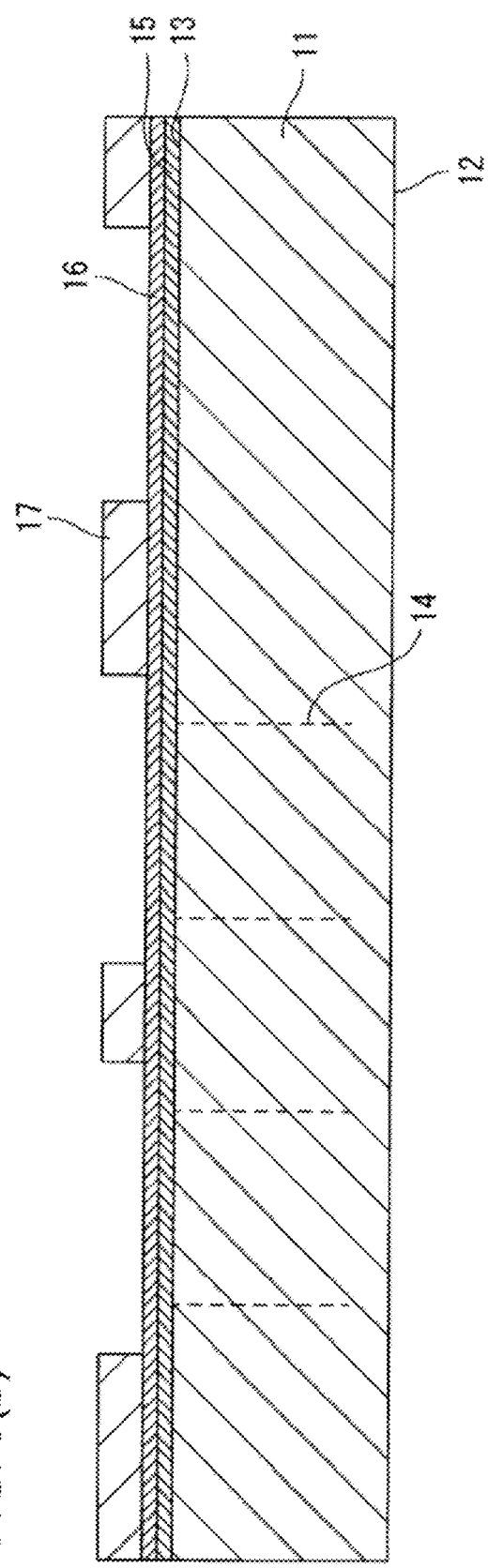

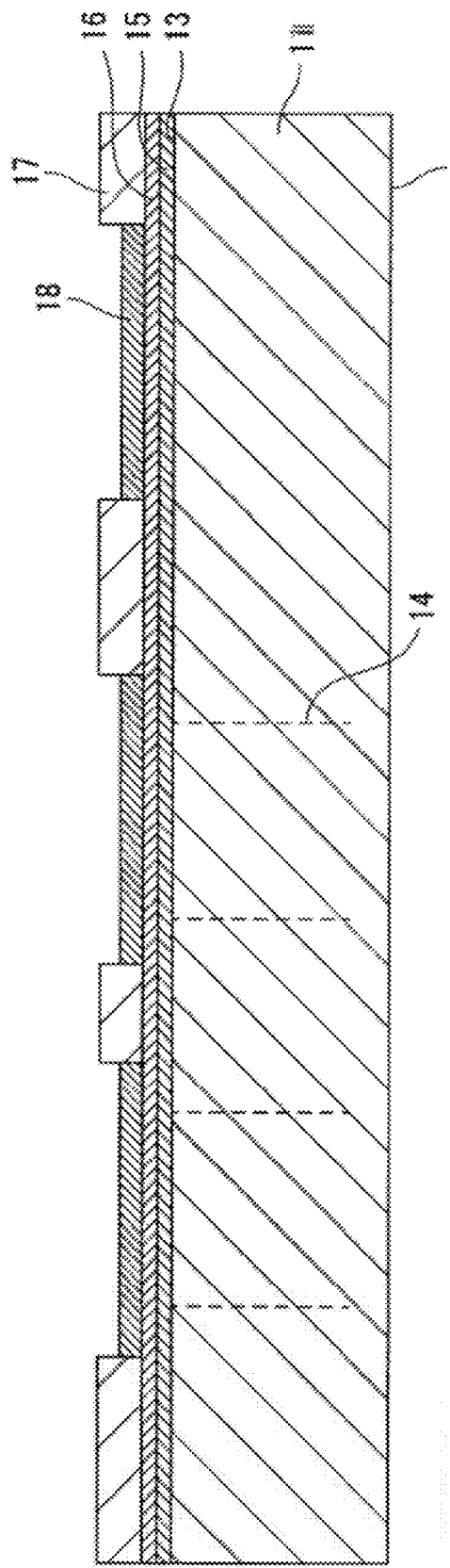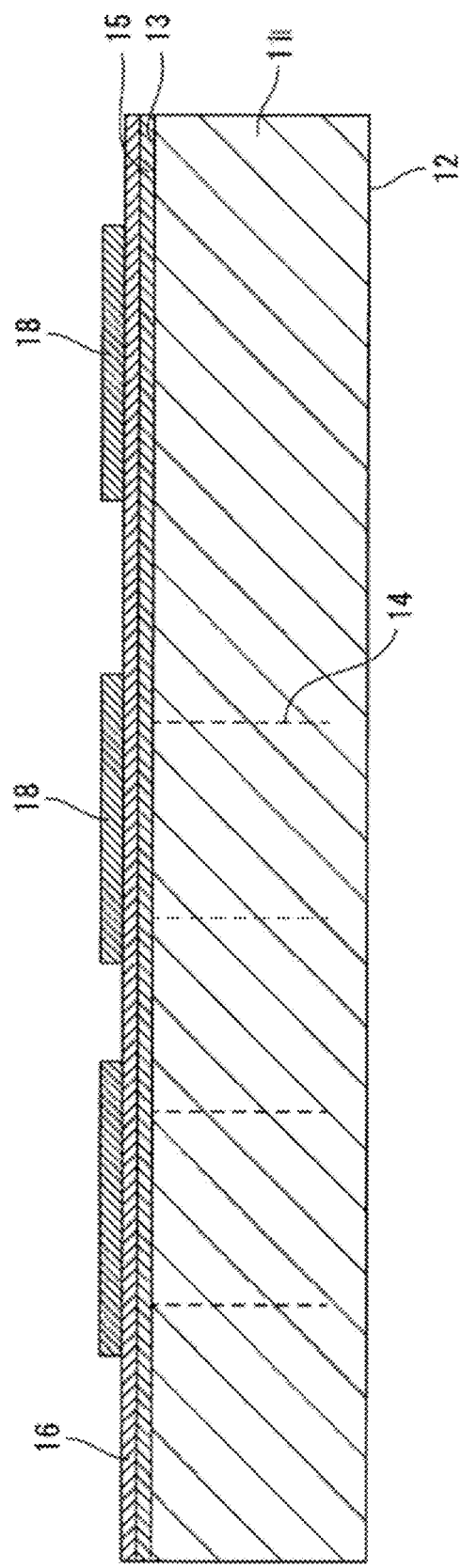

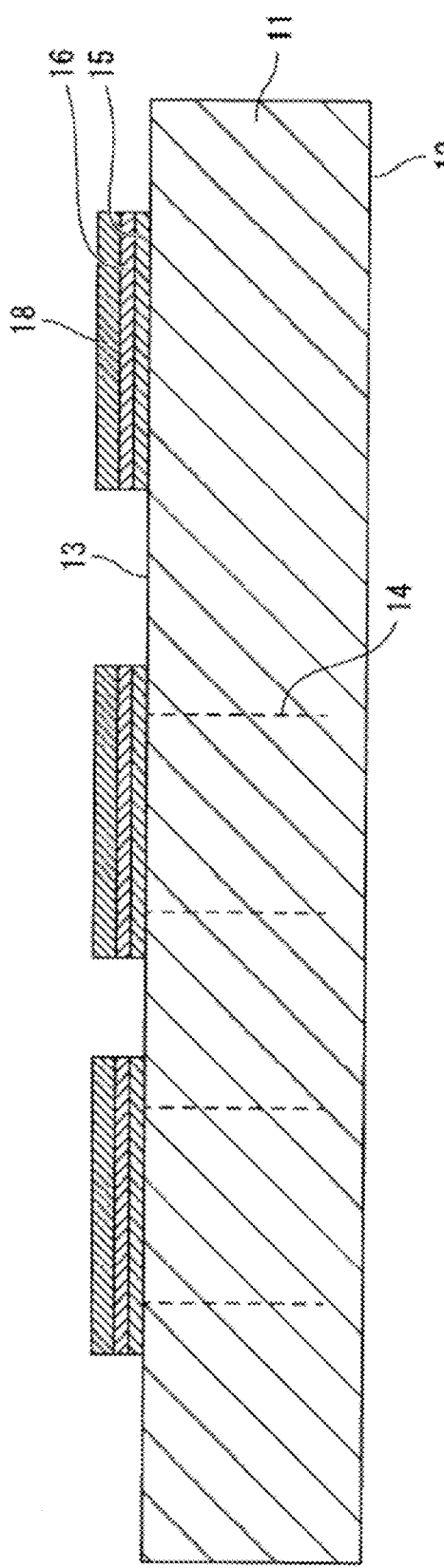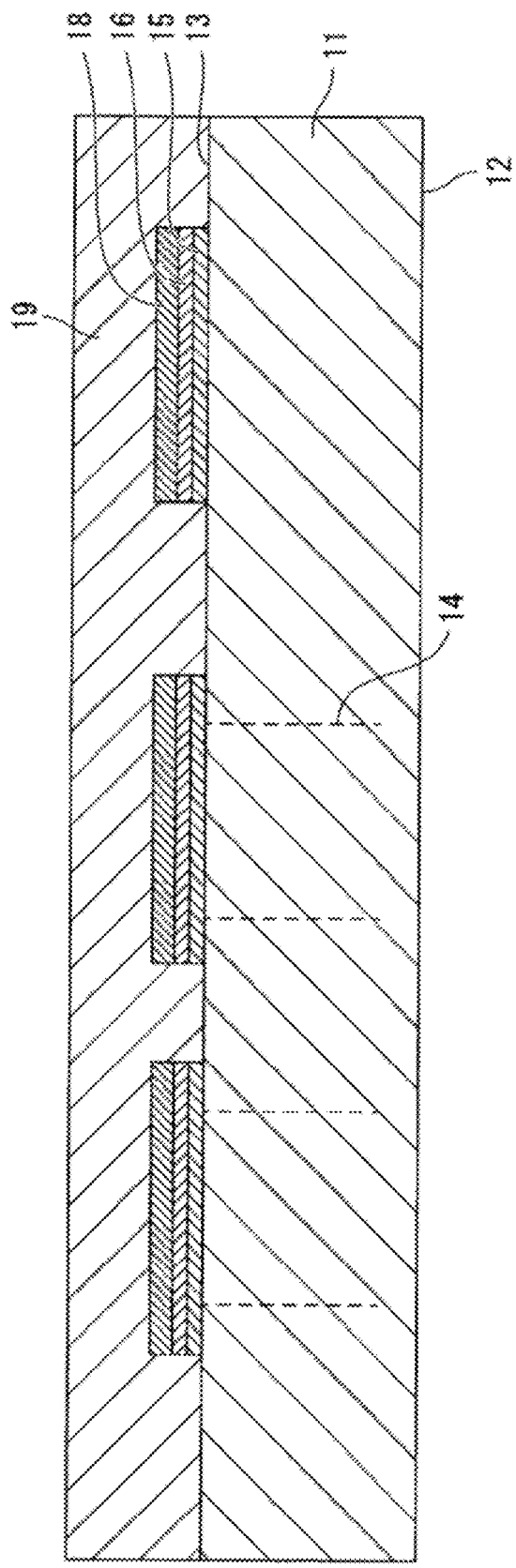

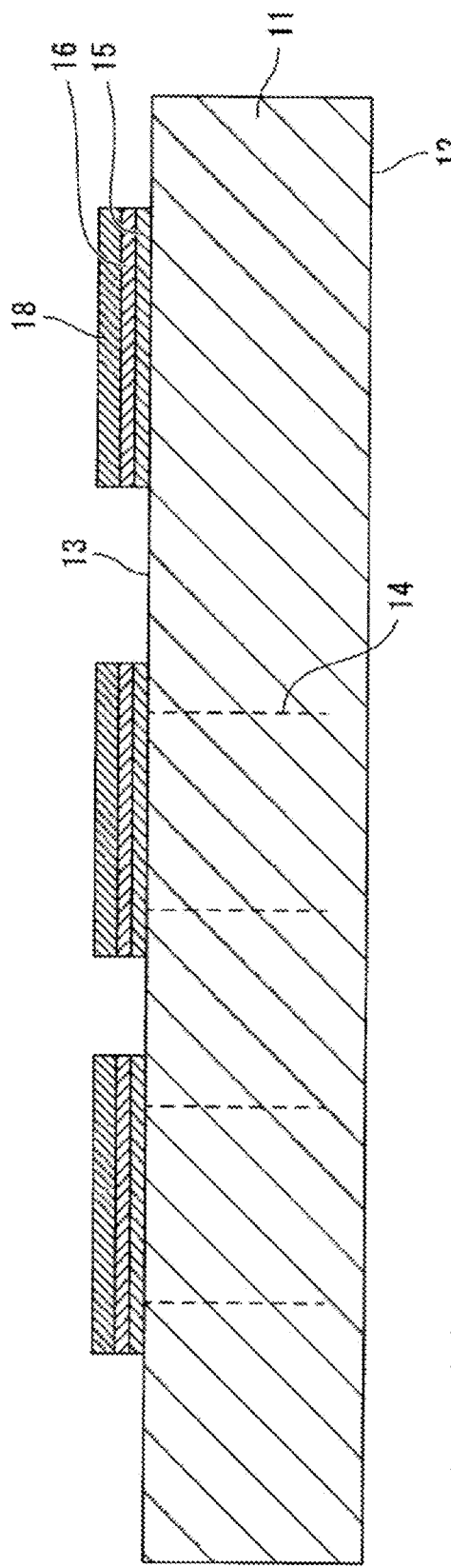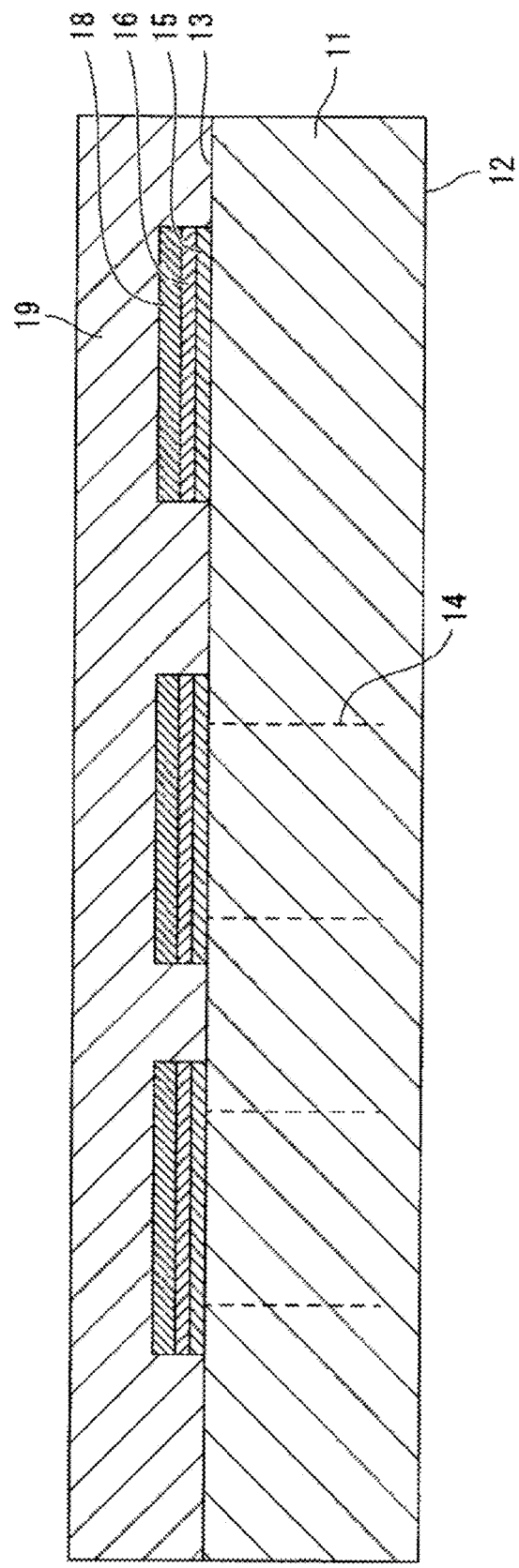

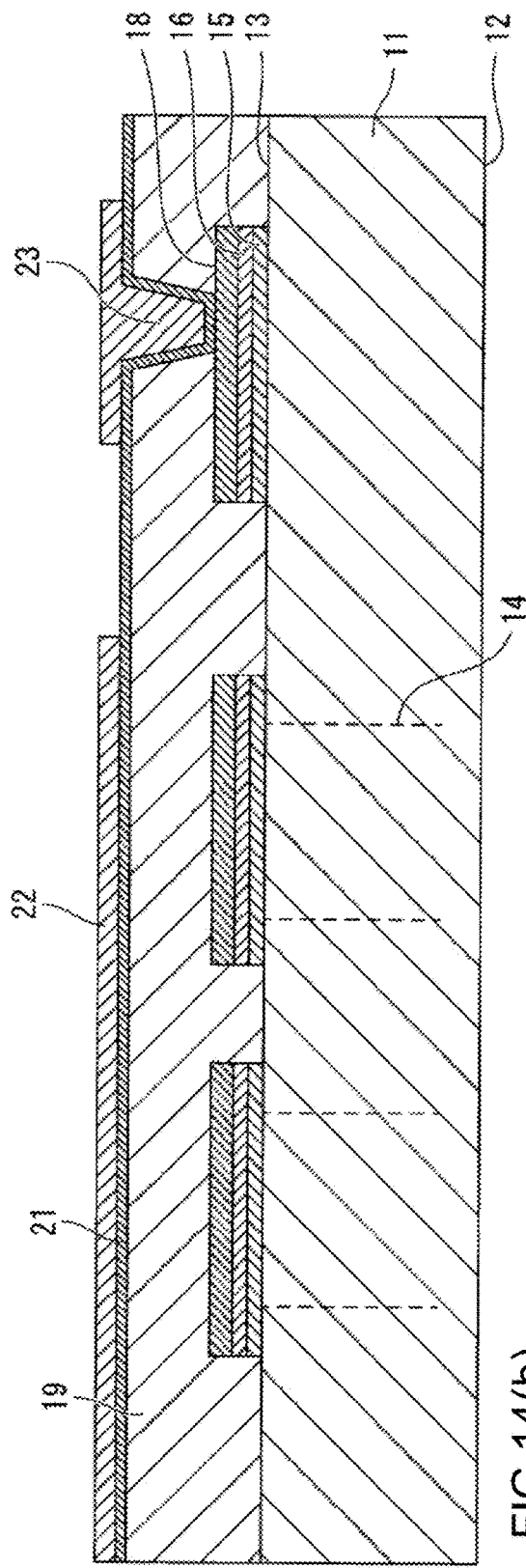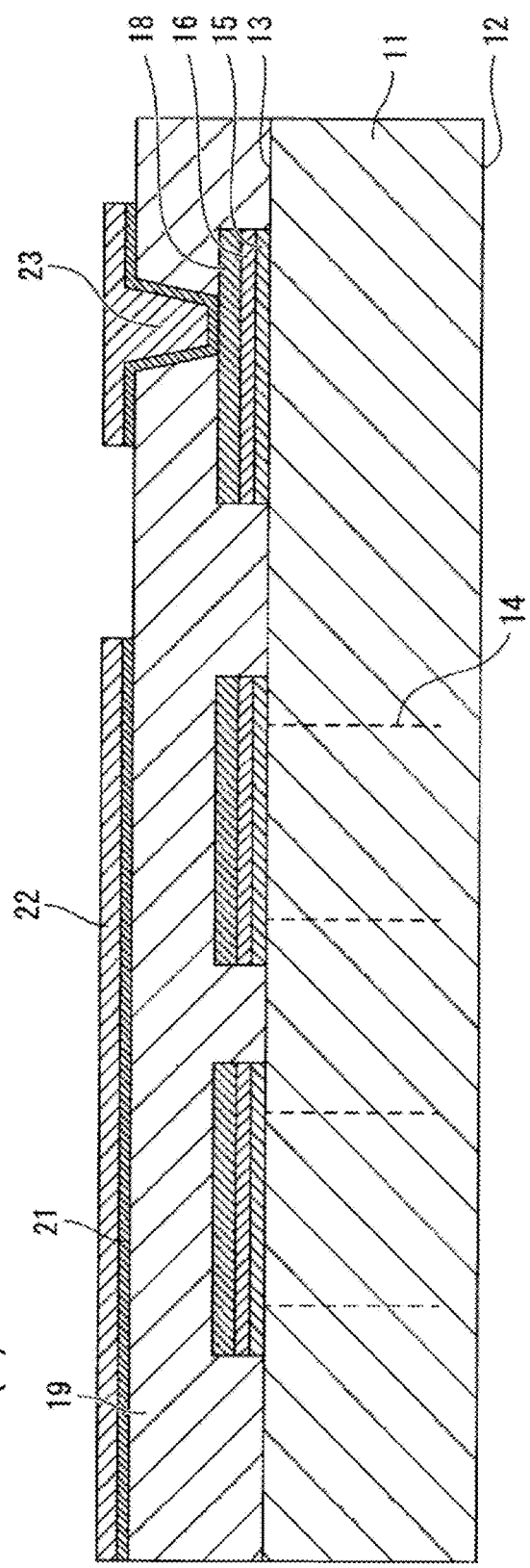

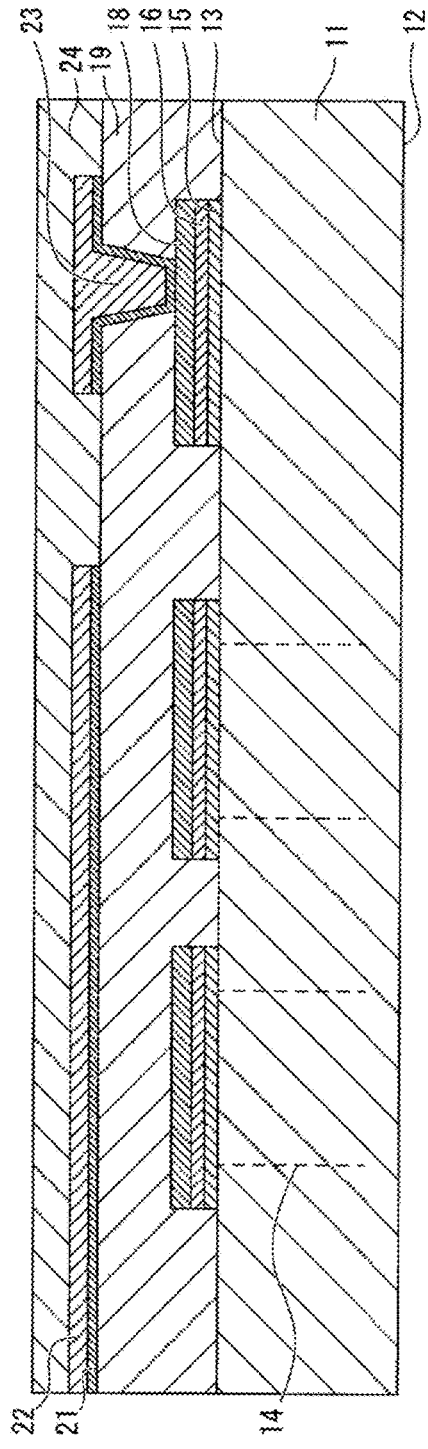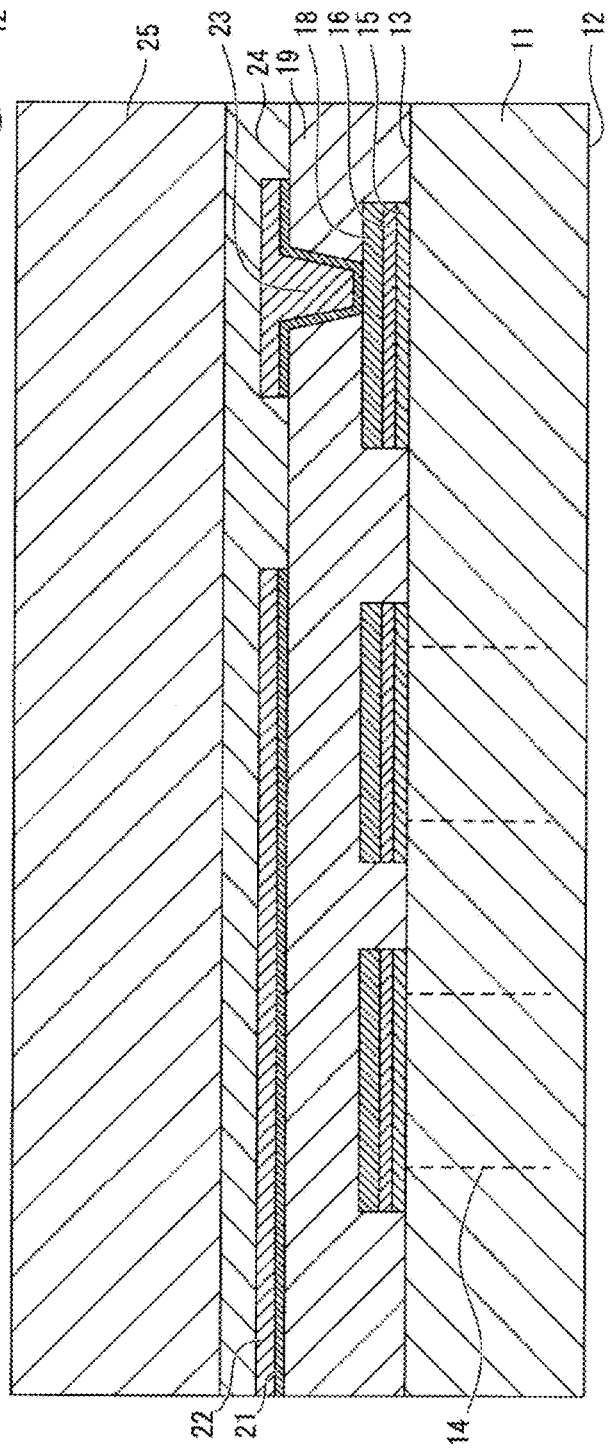

GLASS CORE MULTILAYER WIRING BOARD AND METHOD OF PRODUCING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/042767, filed on Nov. 17, 2020, which is based upon and claims the benefit of priority to Japanese Patent Application No. 2019-208248, filed on Nov. 18, 2019; the disclosures of which are incorporated herein by reference in their entireties.

TECHNICAL FIELD

The present invention relates to a multilayer wiring board including a glass substrate with a through hole and a method for producing the multilayer wiring board.

BACKGROUND

In light of the situation surrounding the communication industry and communication devices in recent years, the communication data volume is increasing due to the expansion of video distribution services. This trend is expected to continue in the future. Take smartphones, which are typical communication devices, as an example, in order to deal with the increasing communication volume, new communication technologies, such as High Band (2.3 to 6.0 GHz) time division duplex (TDD), carrier aggregation (CA), and multiple-input multiple-output (MIMO), have become widespread, resulting in an increase in the number of radio frequency (RF) filters used in a single smartphone.

A transmission/reception duplex system for cellular communication include TDD and frequency division duplex (FDD). TDD is a duplexing technique in which one communication band is divided into successive time slots, and FDD is a duplexing technique using a set of adjacent communication bands (a transmission band is referred to as UL (Up Link), and a reception band is referred to as DL (Down Link)).

While FDD involves symmetric use of radio waves in transmission and reception, TDD enables asymmetric use and has a theoretical advantage in radio usage efficiency over FDD. Further, since TDD is implemented by using one wavelength band, a circuit configuration is simpler than that in FDD that uses two wavelength bands.

Although TDD has a theoretical advantage as described above, the accuracy in synchronization between the terminal and the base station was low and a long blank period was necessary between a transmission period and a reception period at the beginning of digital cellular communication services. Furthermore, FDD is more extensively used due to the advantages in the radio usage efficiency.

The frequency band allocated to present cellular communication is 460 MHz to 6 GHz.

Since the radio wave with lower frequency is superior in terms of transmission characteristics (such as attenuation characteristics and obstacle avoidance), the use of FDD has become widespread using a frequency band of 1 GHz or less.

However, with a recent increase in communication volume, the usage of 1 GHz bands or less has rapidly become overcrowded, and currently the 2 GHz band has also become overcrowded. In such a situation, recent developments in technologies for synchronization between the terminal and the base station contribute to shortening of the blank period in TDD and accelerate more extensive use of TDD.

Advances in synchronization technology lead to high-speed broadband communication. The FDD bandwidth at the beginning of services was 20 MHz or less, but current TDD is used with a broadband of 200 MHz and will further be used with a wider bandwidth. In this situation, broadband TDD in the 2.3 to 6.0 GHz band, which still has unused bands, is expected to be more extensively used in the future.

Smartphones use a bandpass filter (hereinafter, abbreviated as BPF or sometimes referred to as a frequency filter) per band in order to isolate the communication band that is being used from external communication waves which cause noise.

The specification of the communication band used by carriers of countries is studied and created by the Third Generation Partnership Project (3GPP), and the band allocated to a communication carrier is given a band number.

For example, band 12 is specified as an FDD system, uplink (UL) of 699 to 716 MHz, and downlink (DL) of 729 to 746 MHz. This is the specification that uses a narrow band of 17 MHz bandwidth at close intervals of 13 MHz, and an acoustic wave (AW) frequency filter with sharp bandpass characteristics is used.

The AW filter includes a surface acoustic wave (SAW) filter and a bulk acoustic wave (BAW) filter. A SAW filter is a filter having comb-shaped facing electrodes on the piezoelectric body and configured to use resonance of surface acoustic waves. A BAW filter includes a film bulk acoustic resonator (FBAR) and a solid mounted resonator (SMR). An FBAR is a filter having a cavity under a piezoelectric film so as to use the resonance of bulk acoustic waves. An SMR is a filter having an acoustic multilayer film (mirror layer) under the piezoelectric film, instead of having a cavity, so as to use resonance due to reflection of acoustic waves. FBARs are superior to the SMRs in steepness of filter characteristics and allowable insertion power, and are the mainstream of current BAWs. FBARs seem to be more expensive than Saws due to the cavity being produced with advanced MEMS technology.

BAW filters are superior to SAW filters in high-frequency characteristics such as allowable insertion power, and these filters are used in different bands according to the following usage frequencies.

Low Band (up to 1.0 GHz): SAW
Middle Band (1.0 to 2.3 GHz): SAW or BAW
High Band (2.3 GHz or higher): BAW High-end smartphones used around the world embed complicated radio frequency (RF) circuits of 10 to 20 bands in order to communicate by switching bands in accordance with a region of a country and a carrier. Since complication of the circuit board wiring causes signal interference, in the high-end smartphones, a frequency filter, an amplifier, and a switch are put in a module for each band or for each communication system to simplify the circuit board wiring.

Further, in smartphones, since the circuit board and the display element need to be stacked and mounted in an approximately 6 mm-thick casing, the thickness of the module must be within a range of approximately 0.6 to 0.9 mm.

An LC filter in which a solenoid coil and a capacitor are combined may also be used as the frequency filter. However, since the threshold characteristics are broad compared with the AW filter, the LC filter could not be used for the FDD that simultaneously uses two adjacent bands. In contrast, in the TDD that is used with a single band, the LC filter can be used as the frequency filter.

Furthermore, the LC filter has advantages such as allowable insertion power, wide communication band (broadband), and temperature drift compared with the AW filter. Meanwhile, in some cases, the LC filter did not satisfy the reception standard due to the attenuation characteristics with respect to the frequency band that passes through the LC filter being gentle. However, the situation has improved due to optimization of the standard specification in 3.5 GHz band, and LC filters became a promising technology as frequency filters for high band (3.5 to 6.0 GHz) TDD, which will be more extensively used in the future. However, a chip LC filter produced by a conventional LTCC (Low Temperature Co-fired Ceramics) technique has a larger size compared with an AW filter. For this reason, it was difficult to install the LC filter in a thin module of a high-end smartphone, especially due to this thickness.

Similarly, carrier aggregation (CA), which will be extensively used in the future, is a technique that achieves high-speed communication by simultaneously using a plurality of bands. The bands that are simultaneously used include 2.3 to 6.0 GHz TDD bands.

In the frequency filter for CA, the other band signal that is simultaneously used become noise that must be suppressed, and the intensity of the noise is much higher than with conventional external signals.

Thus, the modularization also needs to be changed to the optimization based on the CA unit instead of the unit of the conventional band or communication system.

As described above, how an LC filter is mounted in a thin module of the smartphone is a matter of consideration. In order to address this issue, PTL 1 discloses a technique of incorporating a coil in a circuit board to provide a compact circuit configuration.

[Citation List] [Patent Literature] [PTL 1] JP 2005-268447 A; [PTL 2] JP H7-193214 A.

SUMMARY OF THE INVENTION

Technical Problem

The point of PTL 1 is that glass is used as a core, and a solenoid coil is formed so as to wind around the core. However, the key technique of this structure is how a through hole is formed in the glass, and how the through hole is made conductive to form a through electrode.

In contrast, for example, a method disclosed in PTL 2 is provided. That is, a hole is formed up to the middle of the thickness of the glass by, for example, the Bosch process in a glass core that is thicker than a final form. After forming a continuous conductive layer on the side wall and the bottom of the hole, the glass is polished from the surface facing away from the surface where the hole opening exists. When the glass is scraped off beyond the bottom section of the hole, a conductive through electrode is obtained.

Unfortunately, if an attempt is made to establish electrical conduction between the front and rear sides of the glass using the through electrode after the glass core with the through electrode is obtained by this method, only the cross-section of the conductive layer on the side wall of the through hole can be used for connection at the end of the through electrode exposed by polishing as shown in FIG. 1(c). Due to the small connection area, the reliability in the connection may be insufficient. In FIG. 1, a reference sign 11 denotes a glass core and a reference sign 39 denotes a through electrode.

Since the Bosch process forms a hole in the glass by dry etching, it requires a long time and has issues in practical use and costs.

The present invention has been made in view of the above problems and aims at providing a simpler through-glass electrode and subsequent reliable electrical connection with the through electrode. It is also an objective of the present invention to provide a multilayer substrate with a high-frequency LC filter that uses glass having a through electrode as a core.

Solution to Problem

To solve the problem, one aspect of the present invention includes a glass substrate including a first surface, a second surface facing away from the first surface, and a through hole that penetrates the first surface and the second surface. The diameter of the through hole decreases from the first surface toward the second surface. The second surface is provided with a layer structure that mainly includes a metal or a compound thereof to completely close the hole in the second surface.

With this configuration, since a lid-like structure that completely closes the through hole is formed by the layer structure, as shown in FIG. 2(d), in establishing conduction with the through electrode 39, the entire lid section that closes the through hole can be used as the connecting portion. As a result, compared with a case in which only the cross section of the conductive layer was used, the reliability in the connection is significantly increased.

An aspect of the present invention includes a through electrode located along the side wall of the through hole. The through electrode includes three layers. A first layer is located on part of the side wall of the through hole closer to the first surface and on part or all of the bottom section of the through hole in the second surface closing the opening of the through hole in the second surface. A second layer is located to cover the first layer, the side wall exposed from the first layer, and the bottom section of the through hole in the second surface. A third layer is located on the second layer.

This structure describes the structure that establishes conduction inside the through hole and asserts how a conductive layer can be simply and reliably formed in a through hole in which a conductor is difficult to introduce.

Furthermore, according to one aspect of the present invention, in the layer structure that mainly includes metal or a compound thereof, the metal preferably includes nickel, chromium, or an alloy thereof.

One method for producing the glass core multilayer wiring board according to one aspect of the present invention includes, as will be described later in an embodiment, subjecting glass inside which weakened portions are formed in advance to hydrofluoric acid treatment, thereby preferentially removing the weakened portions to form holes. The above structure assumes such a case, and to prevent the hydrofluoric acid that removed the weakened portions during the hydrofluoric acid treatment from entering beyond the removed section, metal that has corrosion resistance to hydrofluoric acid is placed to cover the weakened portions. Thus, the glass from which the weakened portions are removed by hydrofluoric acid includes vias having bottoms covered with a hydrofluoric acid resistant metal.

In an aspect of the present invention, at least one of the first layer to the third layer preferably comprises a single or a plurality of layers.

Each layer that constitutes the conductive layer may require a layer other than the main layer, such as a layer for improving the adhesion to a base layer or a layer of material that acts as a catalyst for chemical reaction. In view of its potential, the present structure claims the right of the glass core multilayer wiring board with even higher quality achieved by the existence of these layers.

According to one aspect of the present invention, the first layer of the through electrode may be formed by sputtering.

It is physically difficult to laminate a conductive layer in the hole of the glass substrate, specifically on the side wall of the through hole. In many cases, chemical species to be laminated are originally on the outside of the glass material. When the chemical species are to be introduced into the hole in the glass core, the trajectory of the chemical species is parallel to the side wall of the hole of the glass core or forms an angle close to parallel. Thus, necessary energy exchange is hindered between the chemical species to be deposited on the side wall and the chemical species that form the side wall.

For example, in regard to a method in which the motion of chemical species is isotropic such as electroless plating, the difficulty is significantly reduced. However, it is difficult to provide sufficient adhesion to the side wall of the hole formed in the glass core.

A sputtering method is a strongly anisotropic film formation method that forms a film by linearly sputtering the chemical species toward the glass core from the outside of the glass core so that the chemical species collide against the glass core. The method allows easy increasing of the kinetic energy of the chemical species generated in the collision and relatively easy increasing of the adhesion. Additionally, an appropriate amount of gas molecules in the chamber causes the chemical species to scatter by colliding with the gas molecules. This allows forming a film to some extent even in a positional relationship that is originally unfavorable for forming a film. For the above reasons, the structure claims the right of providing the glass core multilayer substrate having superior physical property by using sputtering for forming the conductive film in the hole in the glass core.

According to an aspect of the present invention, the second layer of the through electrode may be formed by electroless plating.

The sputtering claimed above used to form the first layer of the conductive layer is a method that allows relatively easy formation of a film on the side wall in the hole. However, the difficulty of forming the film on the side wall of the through hole increases as the position of the film becomes farther from the hole opening and the hole opening diameter becomes smaller. As a result, as shown in FIG. 3(*b*), the first layer of the conductive layer tends to be laminated on the glass core surface, the bottom section of the through hole in the glass core, and at the section of the side wall of the hole in the glass core close to the aperture.

It is therefore necessary to laminate a layer that serves as the conductive layer or its seed layer by other methods at the section where conductive layers 27 and 28 each serving as the first layer are not laminated, that is, the section of the side wall of the hole away from the opening of the hole as shown FIG. 3(*c*). The electroless plating method is advantageous in that the motion of the chemical species is isotropic, and the difficulty in forming a film on the side wall of the through hole is low. However, the adhesion to the glass is generally low. There are sections where the film is formed on the first layer of the conductive layer besides the sections where the film is directly formed on the glass. To improve the adhesion at those sections, material for forming the first layer and the second layer may be selected to enhance the adhesion. For the above reasons, by selecting the electroless plating method as the method for laminating a second layer 29 of the conductive layer in the hole in the glass core, a higher-quality glass core multilayer wiring board is obtained.

According to an aspect of the present invention, the third layer of the through electrode may be formed by electrolytic plating.

A third layer 32 is the primary layer of the conductive layer and is assumed to occupy the most part of the entire thickness of the third layer 32 (refer to FIG. 3(*d*)). At the step in which the second layer 29 is laminated, the inner wall of the hole is entirely covered with the conductive layer. As the method for laminating the third layer, a method that relatively quickly forms a layer with a thickness to some extent was considered to be appropriate provided that the section to be laminated would be made conductive. Thus, by using electrolytic plating as the method for forming the third layer, a higher-quality glass core multilayer wiring board is obtained.

According to an aspect of the present invention, a first wiring layer formed of a conductor may be placed on the first surface and a second wiring layer formed of the conductor may be placed on the second surface, and respective insulation layers and respective conductive wiring layer may be alternately laminated on the each of the first wiring layer and the second wiring layer.

Although there is always a necessary amount of conductive wiring to achieve the function of the present substrate, if the conductive wiring cannot be fit due to the limitation in the area of the entire substrate, or if it is necessary to stack the wiring layers in the thickness direction due to the restriction in terms of the function of the wiring layers, one of the solutions is to divide the wiring layers into some groups of layers and stack the groups of layers with an insulation layer located in between to prevent a short-circuit. With such a multilayer structure, a higher-quality and high value-added glass core multilayer wiring board is obtained.

According to an aspect of the present invention, a hole that penetrates the insulation layer may be formed and a conductive material may be placed inside the hole to form a through electrode. The through electrode may electrically connect the conductive wiring layers.

The wiring layers, on their own, are insulated from each other by the insulation layer located in between. However, it is necessary to establish conduction at appropriate locations as required to exhibit the required function. As such a method, a via is formed in the insulation layer, and the via is filled with a conductive material to produce a through electrode. This gives a higher-quality glass core multilayer wiring board.

According to an aspect of the present invention, by connecting the through electrode to each of the wiring layers located on the first surface and the second surface, an inductor including a solenoid coil that is spirally wound around the glass core may be located inside the layer structures.

The reasons for using glass as the core material include that high dimensional stability of the wiring layer formed on the glass is expected due to its smooth surface, and that the glass is highly suitable for a high-frequency circuit due to low dielectric constant. By positively utilizing this, a high-frequency inductor can be formed around the glass core.

According to an aspect of the present invention, at least an electrode may be placed in the conductive layer, and another electrode that is parallel to the above-mentioned electrode may be placed to sandwich a dielectric layer in between to form a capacitor. The capacitor may be located inside the layer structure.

With this configuration, making use of the properties of the glass, a high-frequency part can be formed in the substrate.

According to an aspect of the present invention, the inductor and the capacitor may be appropriately connected in a pair or a plurality of pairs to form a frequency filter. The frequency filter may be located inside the multilayer substrate.

With this configuration, a high-quality substrate with an embedded filter is obtained by forming a frequency filter constituted by an inductor and a capacitor in the glass core multilayer wiring board.

Advantageous Effects of the Invention

An aspect of the present invention provides a simpler through-glass electrode and a glass core multilayer wiring board that has subsequently reliable electrical connection with the through electrode.

BRIEF DESCRIPTION OF THE DRAWINGS

FIGS. 7(a)-7(b) are views illustrating a production process of a circuit board according to the embodiment of the present invention.

FIGS. 9(a)-9(b) are views illustrating the production process of the circuit board according to the embodiment of the present invention.

FIGS. 11(a)-11(b) are views illustrating the production process of the circuit board according to the embodiment of the present invention.

FIGS. 14(a)-14(b) are views illustrating the production process of the circuit board according to the embodiment of the present invention.

FIGS. 15(a)-15(b) are views illustrating the production process of the circuit board according to the embodiment of the present invention.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

As used herein, "above" refers to a direction receding from the glass core, whereas "below" refers to a direction approaching the glass core.

Figure 6:
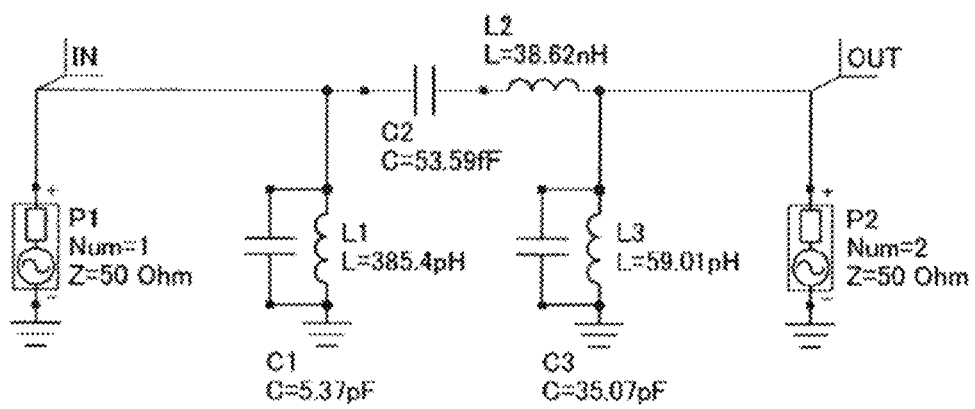
FIG. 6 is a circuit diagram of a bandpass filter included in the embodiment of the present invention.

First, in order to design a circuit, which serves as a high-frequency filter, required capacitance and inductance depending on the frequency bands of the radio waves intended to be passed or blocked are calculated using simulation software. A filter that passes frequencies in a band of, for example, 3300 MHz or higher and 3700 MHz or lower has a circuit configuration as shown in FIG. 6. To achieve this, the size of electrodes, the distance between the electrodes, and the dielectric constant of a dielectric are designed for the capacitor, and the cross-sectional area of a wire, the number of turns, and the length of the inductor are designed while taking the processability and space efficiency into consideration. Examples of the design are shown in Table 1 and Table 2. In Table 2, the number of turns of the inductances L1 and L3 is blank. This is because the inductance required of the elements is very small, and even a single turn is unnecessary. This means that the self-inductance generated in a state in which a wire is mounted straight is enough.

TABLE 1

|  | C1 | C2 | C3 |
|---|---|---|---|
| CAPACITANCE | 5.37 pF | 53.59 fF | 35.07 pF |
| DIELECTRIC | SiN | SiN | SiN |
| DIELECTRIC CONSTANT | 6.3 | 6.3 | 6.3 |
| DIELECTRIC THICKNESS | 200 nm | 200 nm | 200 nm |
| LENGTH OF ONE SIDE | 138.7 μm | 13.9 μm | 354.5 μm |

TABLE 2

|  | L1 | L2 | L3 |
|---|---|---|---|
| INDUCTANCE | 385.4 pH | 38.62 nH | 59.01 pH |
| NUMBER OF TURNS |  | 11 |  |
| COIL WIDTH |  | 1.6 mm |  |
| COIL LENGTH |  | 1.5 mm |  |
| COIL THICKNESS |  | 0.3 mm |  |
| WIRING LENGTH | 1.33 mm |  | 0.2 mm |
| WIRING WIDTH | 0.1 mm |  | 0.1 mm |
| WIRING THICKNESS | 15 μm |  | 15 μm |

The capacitance and inductance of the BPFs for other bands that are mounted on a high-frequency module substrate are also calculated using the same procedure as that described above to design a required circuit (values are omitted).

Next, an example of a capacitor and an inductor as circuit elements of an LC circuit will be described by using an example of a substrate in which a wiring layer and an insulating resin layer are alternately formed on each of the first surface and the second surface of a glass substrate as a core material.

Figure 1A:
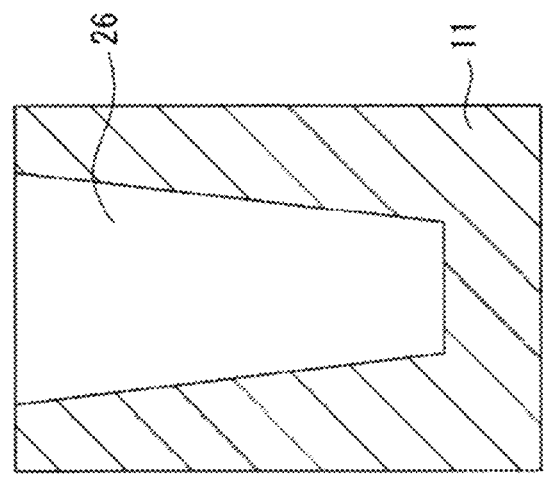
FIGS. 1(a)-1(c) are reference diagrams illustrating a method for producing a through electrode according to a conventional technique.
Figure 1B:
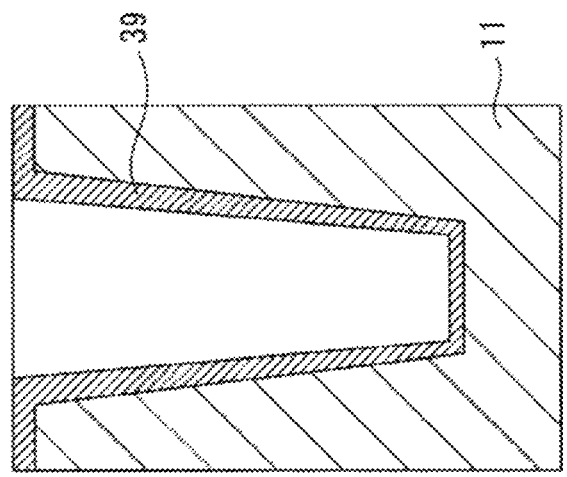
Figure 1C:
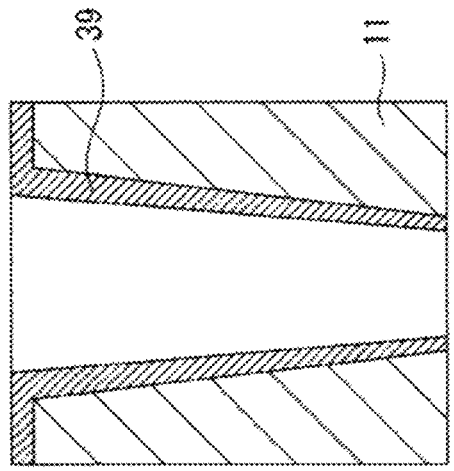
Figure 2A:
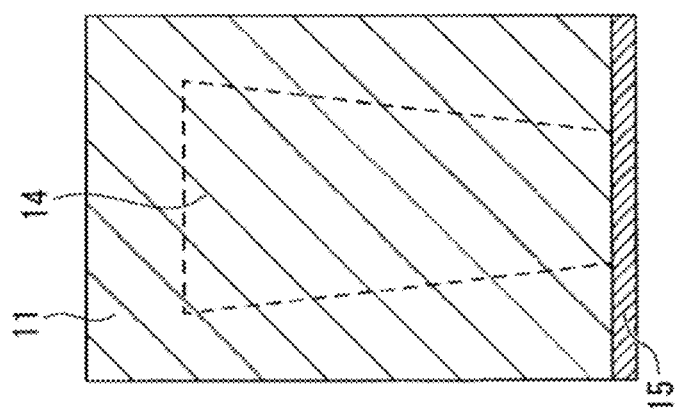
FIGS. 2(a)-2(d) are reference diagrams illustrating a method for producing a through electrode according to the present invention.
Figure 2B:
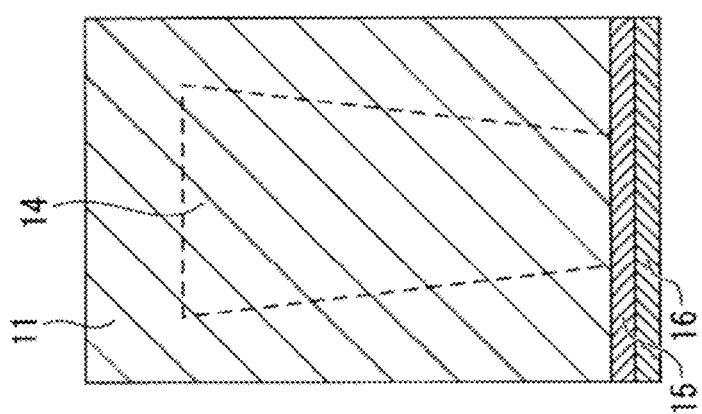
Figure 2C:
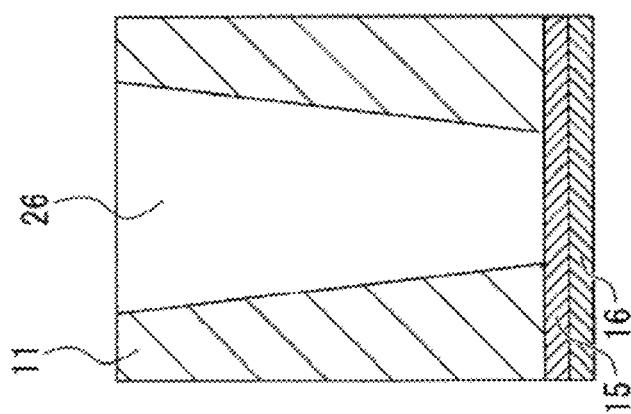
Figure 2D:
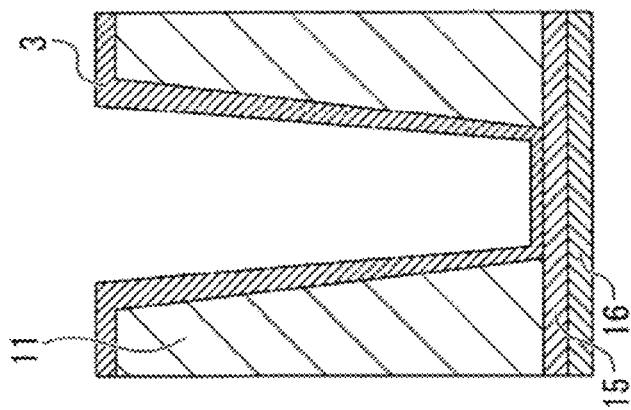
Figure 2A:
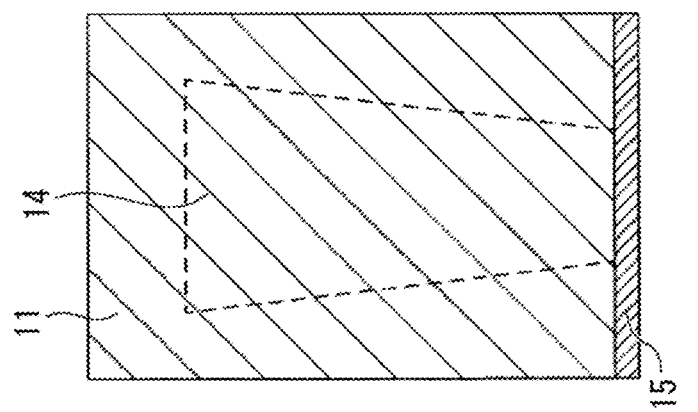
Figure 2B:
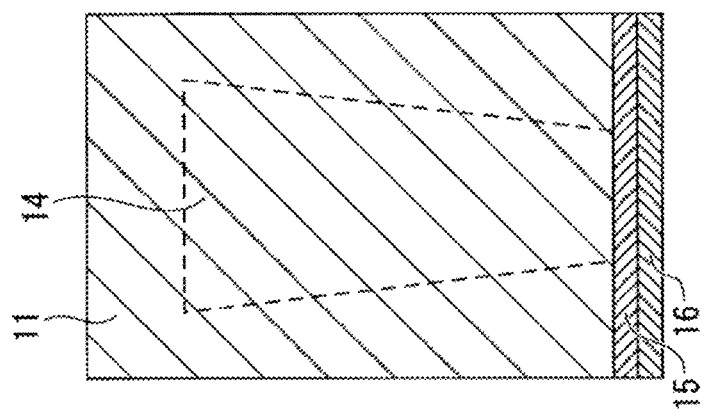
Figure 2C:
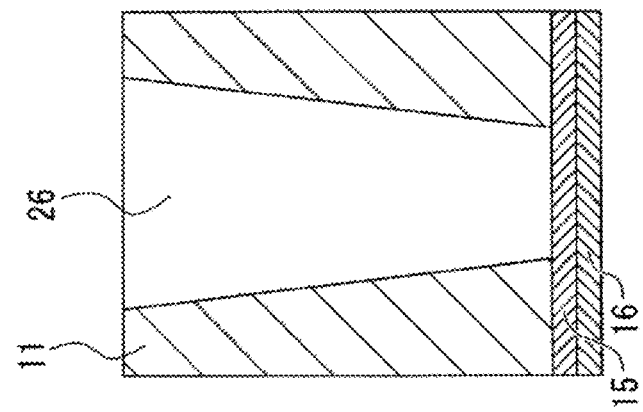
Figure 2D:
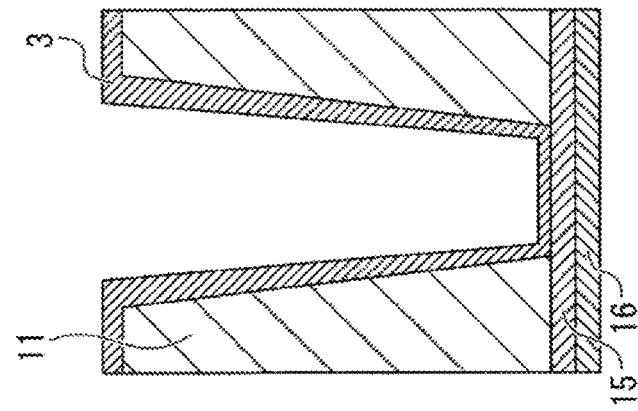
Figure 3A:
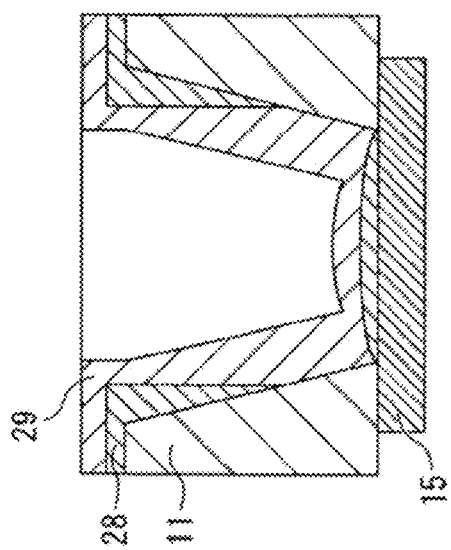
FIGS. 3(a)-3(e) are reference diagrams illustrating a procedure for obtaining electrical connection to the inside of a hole in a glass core according to the present invention.
Figure 3B:
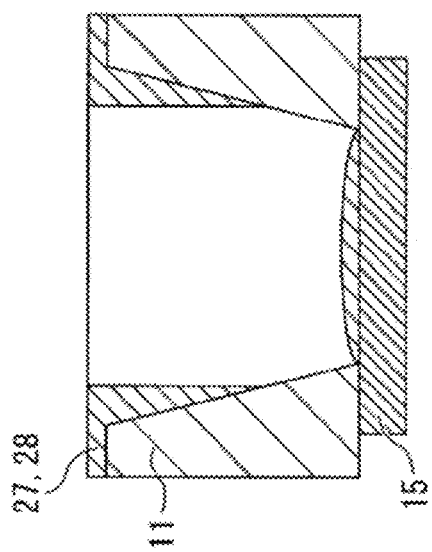
Figure 3C:
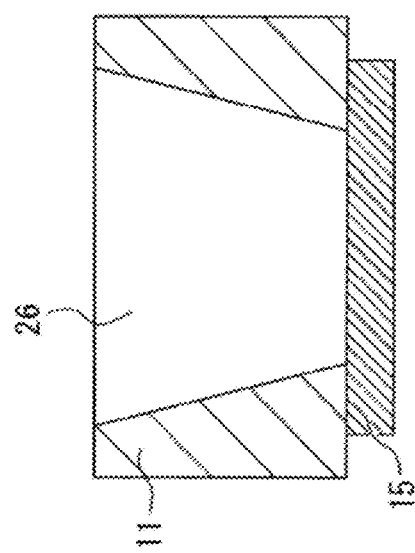
Figure 3D:
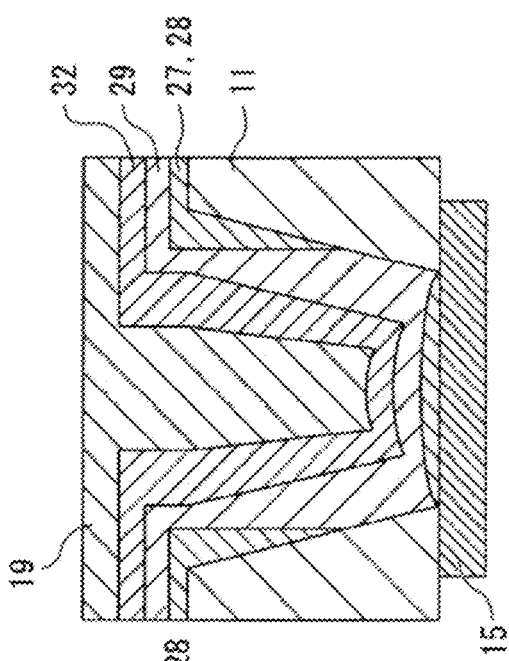
Figure 3E:
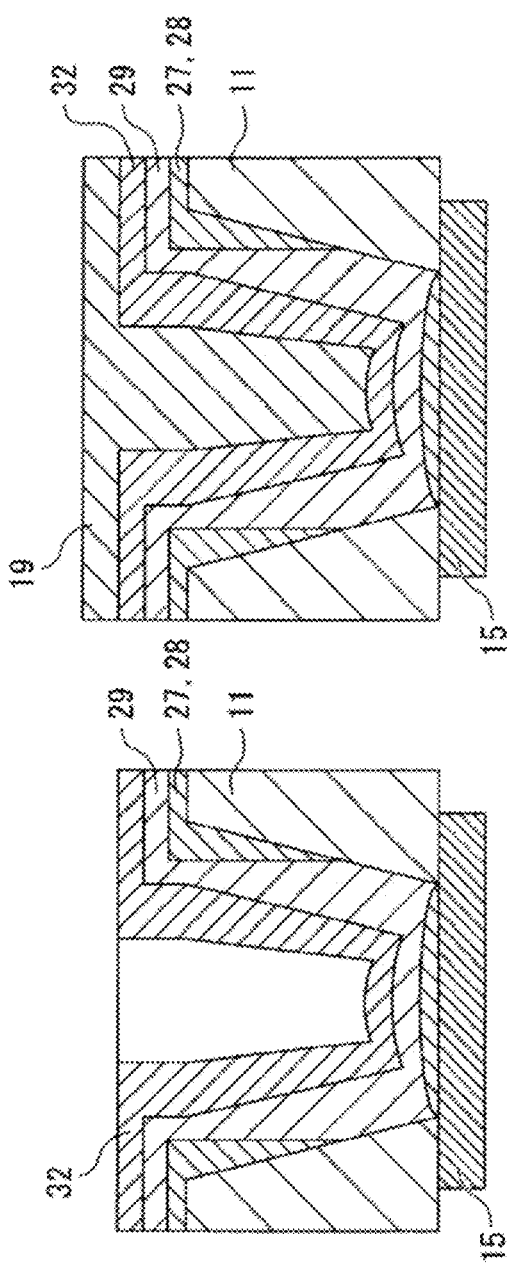
Figure 4:
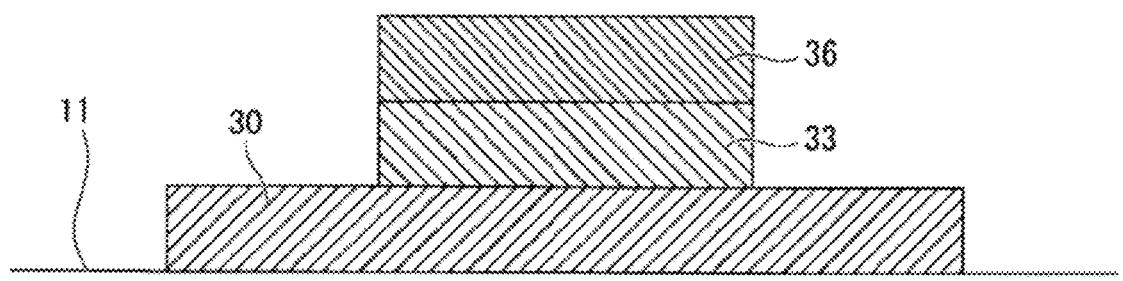
FIG. 4 is a cross-sectional view of a capacitor included in the embodiment of the present invention.

The capacitor has a structure in which a dielectric is sandwiched between two conductor plates. An example of the capacitor is shown in FIG. 4, in which an insulating resin layer 11 formed directly above or on a glass substrate (not shown) is laminated with a lower electrode 30 to form a conductor pattern. The conductor pattern is further laminated with a dielectric layer 33 and a conductor 36, which serves as an upper electrode, in this order. The lower electrode 30 and the upper electrode 36 generally have a multi-layer structure including a seed layer and a conductive layer.

Figure 5:
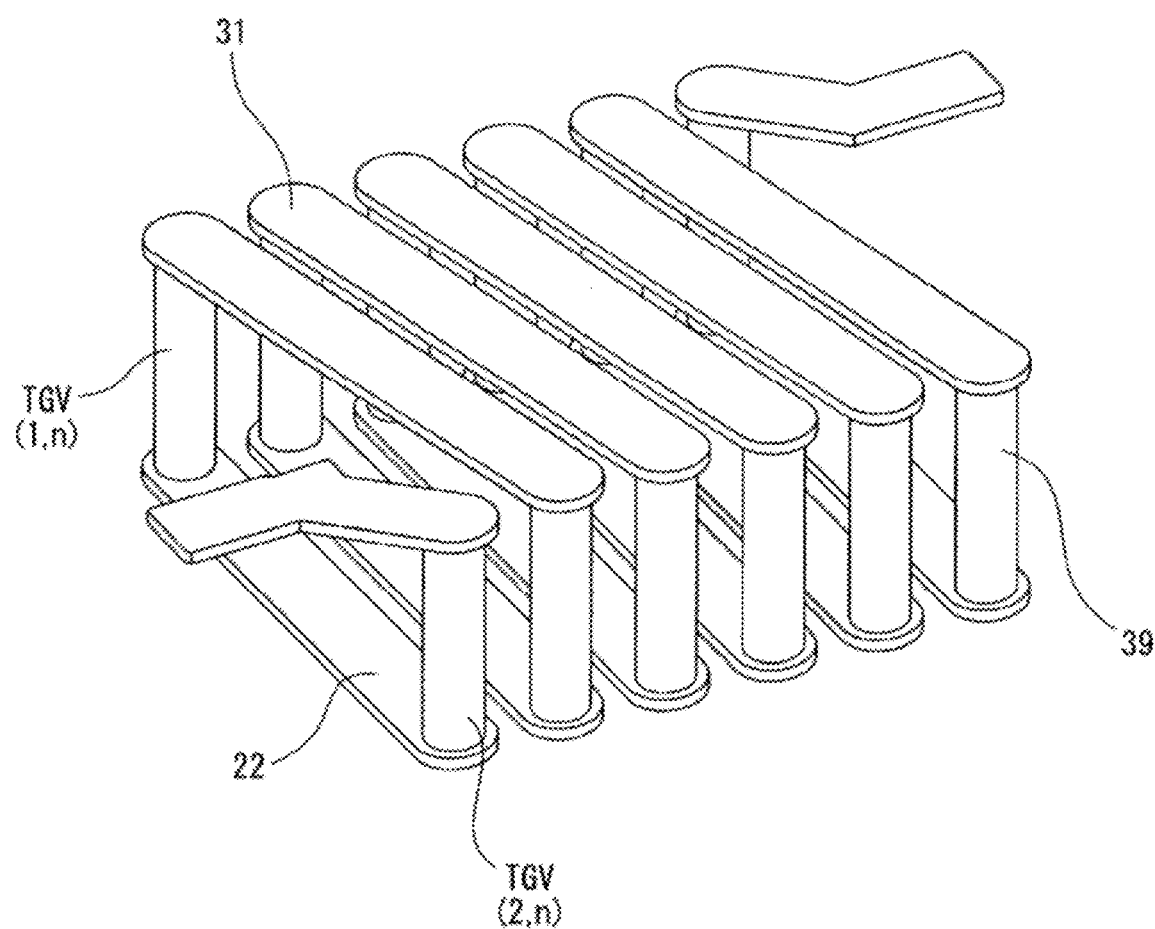
FIG. 5 is a perspective view of an inductor included in the embodiment of the present invention.

The inductor can be embedded in a substrate having through holes to provide the same performance as that of a spiral coil. In FIG. 5, a parallel flat glass substrate having through holes arranged in two rows is shown transparent. As shown in FIG. 5, wiring 22 and 31 (wiring layer) are disposed on the front and rear sides of the glass substrate so as to connect the openings of the adjacent through holes, while forming a conductor layer, which is a through electrode 39, on an inner wall of a through hole that penetrates the glass substrate between the front and rear sides. The through electrode 39 is a through glass via (hereinafter, referred to as TGV).

In FIG. 5, the nth TGV in the first row is referred to as TGV (1, n), and the nth TGV in the second row is referred to as TGV (2, n). The TGV (1, n) and the TGV (2, n) are connected by the wiring 22 on the rear side, whereas the TGV (1, n) and the TGV (2, n+1) are connected by the wiring 31 on the front side. Thus, the wiring 22, the TGV (1, n), the wiring 21, and the TGV (1, n+1) form an open circuit of the conductor having one turn around the outer and inner surfaces of the glass substrate. When supplied with a current, the circuit functions as an inductor. The characteristics of the inductor can be adjusted by, for example, changing the number of turns.

Next, the configuration of the glass core multilayer wiring board according to the present embodiment will be described.

The glass core multilayer wiring board of the present embodiment includes a glass substrate, a through electrode, a first layer structure, and a second layer structure. The glass substrate includes a first surface, a second surface facing away from the first surface, and a through hole having a diameter decreases from the first surface toward the second surface. The through electrode is located along the side wall of the through hole. The first layer structure and the second layer structure are formed of a conductive material (metal or material mainly made of a compound thereof). The first layer structure is provided on the first surface of the glass substrate and the second layer structure is provided on the second surface of the glass substrate. The second layer structure is formed to close the opening of the through hole in the second surface to define a bottom section of the through hole. The through electrode includes three layers. A first layer of the three layers is located on part of the side wall of the through hole closer to the first surface of the glass and part or all of the bottom section of the through hole in the second surface that closes the opening of the through hole in the second surface. A second layer of the three layers is located to cover the first layer and the side wall of the through hole exposed from the first layer and the bottom section of the through hole in the second surface. A third layer of the three layers is located on the second layer.

The metal in the conductive material constituting the layer structure is preferably nickel, chromium, or an alloy thereof.

At least one of the three layers comprises a plurality of layers.

The layer structure includes a wiring layer, which is constituted by a conductor located on the first surface and the second surface, and an insulation layer and a conductive wiring layer alternately laminated on the wiring layer.

It is preferable to include a through electrode including a hole and a conductive material located inside the hole. The hole penetrates the respective insulation layers. The through electrode preferably electrically connects the first wiring layer located on the first surface and the second wiring layer located on the second surface.

An inductor may be formed that is constituted by a solenoid coil that is spirally wound around the glass core by connecting the through electrode and both wiring layers located on the first surface and the second surface.

An electrode may be placed in the conductive layer, and another electrode that is parallel to the above-mentioned electrode may be placed to sandwich the dielectric layer in between to form a capacitor. The capacitor may be located inside the layer structure.

An inductor is formed that is constituted by a solenoid coil that is spirally wound around the glass core by connecting the through electrode and the wiring located on the first surface and the second surface. An electrode is placed in the conductive layer, and another electrode that forms a pair with the above-mentioned electrode is placed to sandwich the dielectric layer in between to form a capacitor. The capacitor is located inside the layer structure. The inductor and the capacitor are connected in a pair or a plurality of pairs to form a frequency filter, and the frequency filter may be located inside the layer structure.

The first layer is formed by, for example, sputtering.

The second layer is formed by, for example, electroless plating.

The third layer is formed by electrolytic plating.

Next, a method for producing the glass core multilayer wiring board according to the present embodiment will be described with reference to FIGS. 7 to 39. Note that, the dimensions and the like shown below are values used only as a reference, and the present invention is not limited to these values.

First, as shown in FIG. 7(*a*), a low-expansion glass core 11 (thickness of 500 μm, rectangular plate of 320 mm×400 mm, CTE: 3.5 ppm/K) is prepared.

Next, as shown in FIG. 7(*b*), a first surface 12 of the glass core 11 is irradiated with femtosecond laser to form laser modified sections 14 (weakened sections 14 in the glass core), which serve as starting points of the through holes during the subsequent glass etching process using hydrofluoric acid. The focus of the femtosecond laser was continuously moved during processing so that each modified section was continuously formed from the position at the depth of 200 μm from the first surface of the glass core to the depth corresponding to the second surface.

Figure 8A:
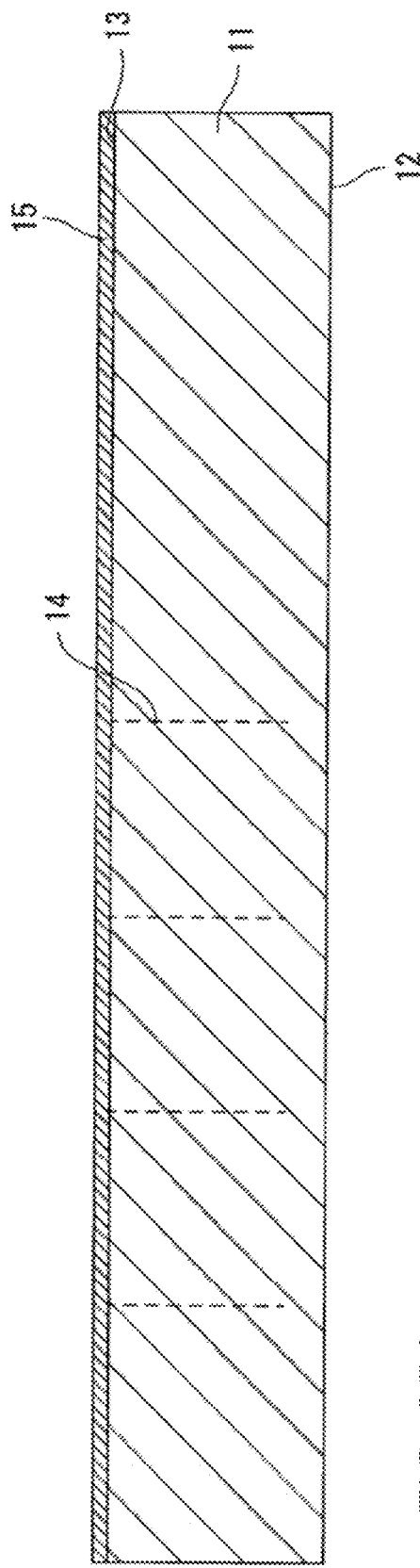
FIGS. 8(a)-8(b) are views illustrating the production process of the circuit board according to the embodiment of the present invention.
Figure 8B:
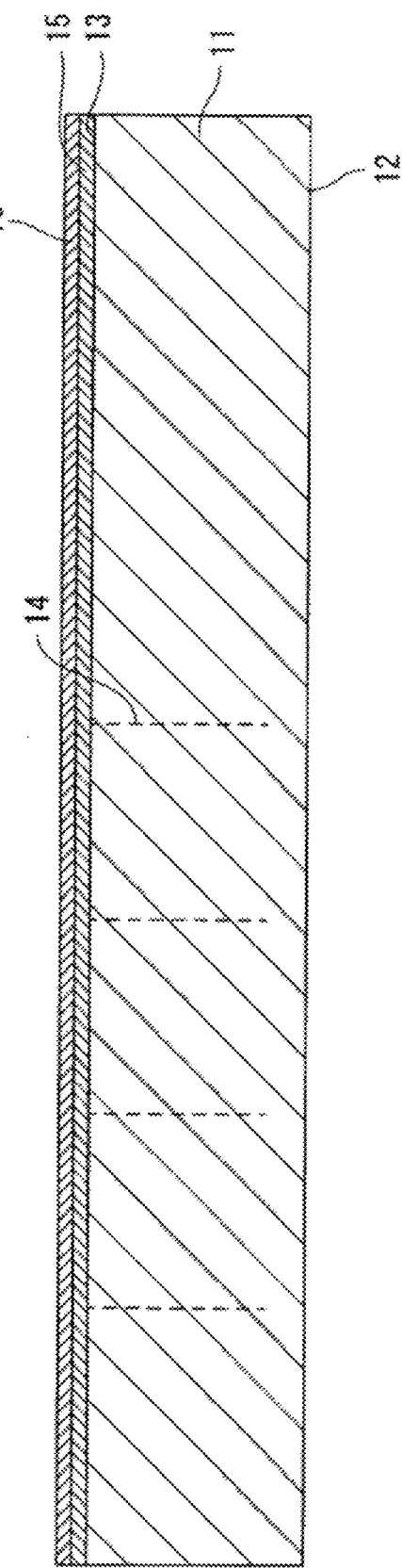

Next, as shown in FIG. 8(*a*), a chromium layer 15 (hydrofluoric acid resistant layer 15) with a thickness of 200 nm was formed by sputtering on the entire second surface 13 of the glass core. Subsequently, as shown in FIG. 8(*b*), a copper layer 16 with a thickness of 200 nm was formed by sputtering on the chromium layer 15. Since the chromium layer 15 has corrosion resistance to hydrofluoric acid, the chromium layer 15 has an effect of stopping the etching during the subsequent glass etching process.

Subsequently, as shown in FIG. 9(*a*), a photoresist 17 was applied on the sputtered layer on the second surface of the glass core. Furthermore, as shown in FIG. 9(*b*), patterning by photolithography was performed to expose sections that are intended to be wiring layers later on.

Figure 10A:
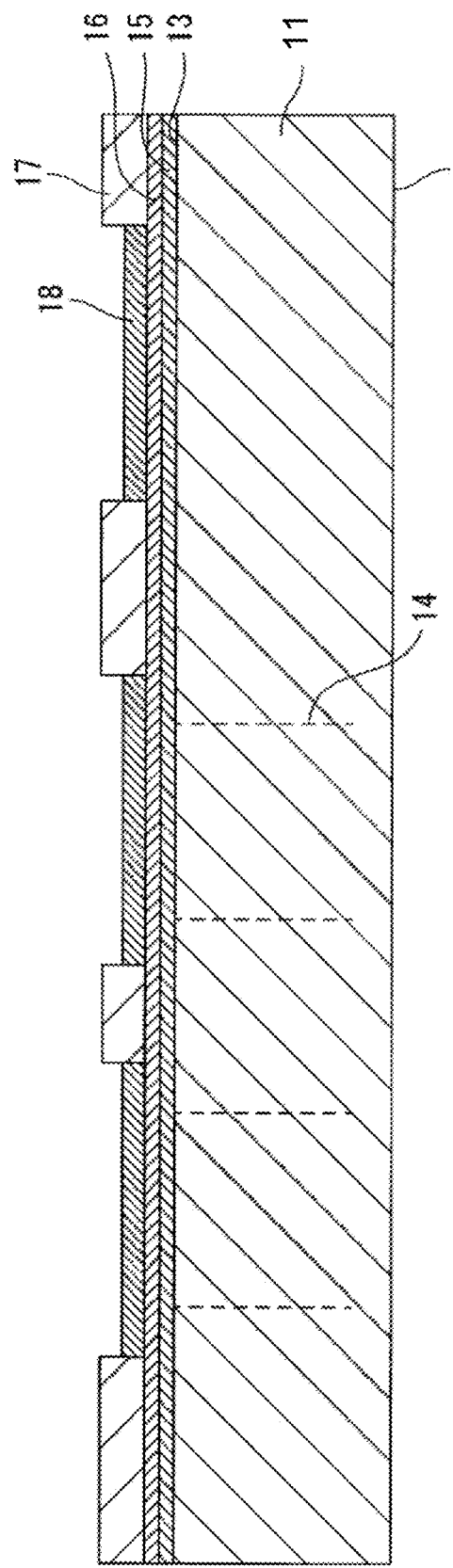
FIGS. 10(a)-10(b) are views illustrating the production process of the circuit board according to the embodiment of the present invention.
Figure 10B:
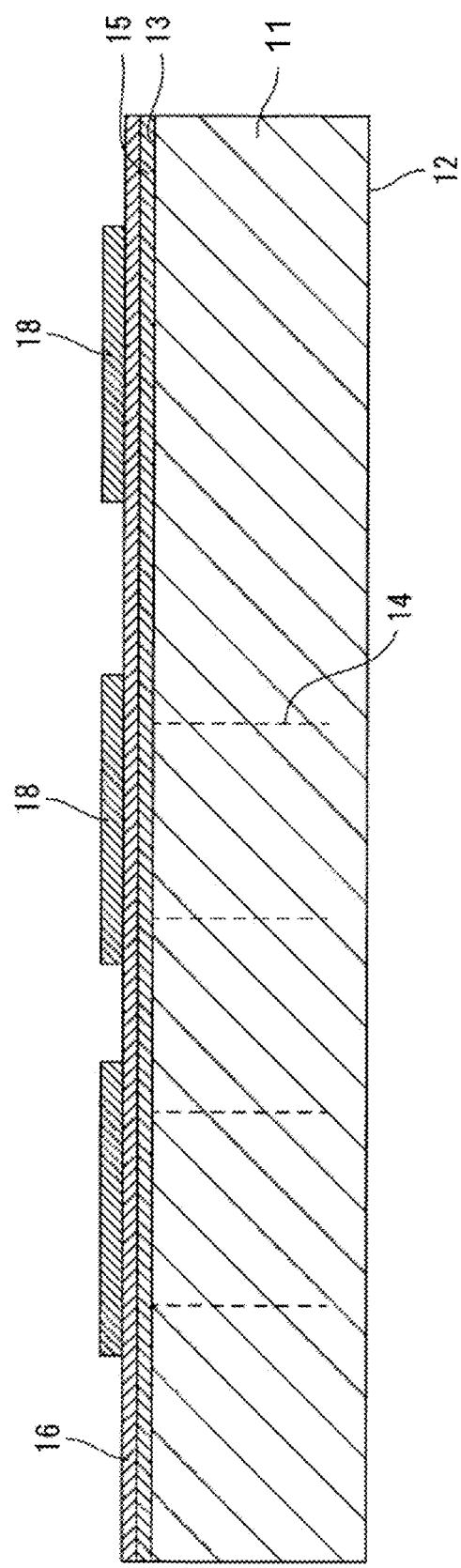

Subsequently, as shown in FIG. 10(*a*), a copper wiring layer 18 (wiring layer) with a thickness of 12 μm was formed on the sections of the second surface of the glass core exposed from the photoresist pattern by electrolytic copper plating. After that, as shown in FIG. 10(*b*), the photoresist 17 used to form the resist pattern was stripped and removed.

In this state, the hydrofluoric acid resistant chromium layer and the sputtered copper layer are laminated on the sections of the second surface of the glass core that are not the wiring pattern. As shown in FIG. 11(*a*), these layers are removed by a wet etching process. At this time, although the copper layer formed by electrolytic plating at the top layer of the wiring pattern also slightly dissolves, since the copper layer is very thick compared with the chromium layer and the sputtered copper layer, appropriately selecting the etching conditions and etching time will allow removing only the unnecessary chromium layer and sputtered copper layer while leaving the copper pattern and the underlying chromium layer and sputtered layer on the second surface of the glass core.

Subsequently, as shown in FIG. 11(b), an insulating resin layer 19 was formed by laminating an insulating resin sheet on the second surface of the glass core. In an example, an insulating resin produced by Ajinomoto Fine-Techno Co., Inc. (product name: ABF-GX-T31R) was used as the insulating resin sheet and was laminated by a vacuum press laminator, but it is not necessarily limited thereto. The insulating resin sheet may be selected as required. The thickness of the insulating resin sheet was set to 25 µm. In this regard, the thickness needs to be enough to completely cover the wiring layer on the second surface of the glass core. In the case of the example, since the thickness of the wiring layer is approximately 12 µm including the base such as the hydrofluoric acid resistant layer, it was determined that 25 µm was sufficient for the thickness of the insulating resin sheet.

Figure 12A:
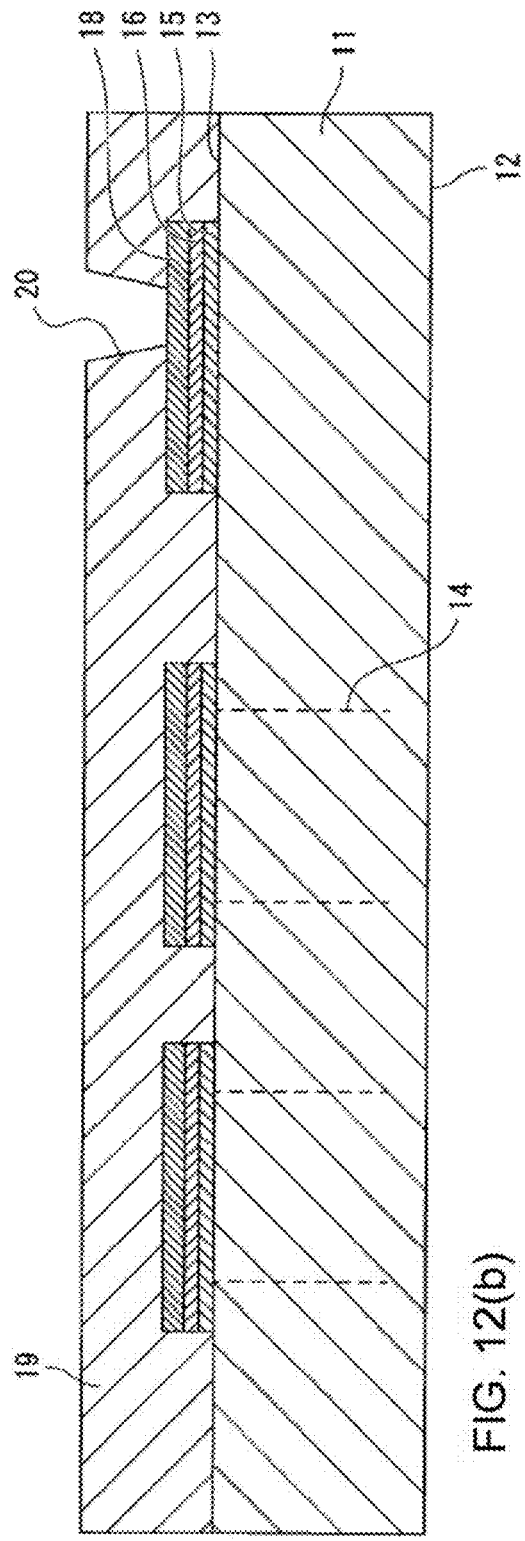
FIGS. 12(a)-12(b) are views illustrating the production process of the circuit board according to the embodiment of the present invention.
Figure 12B:
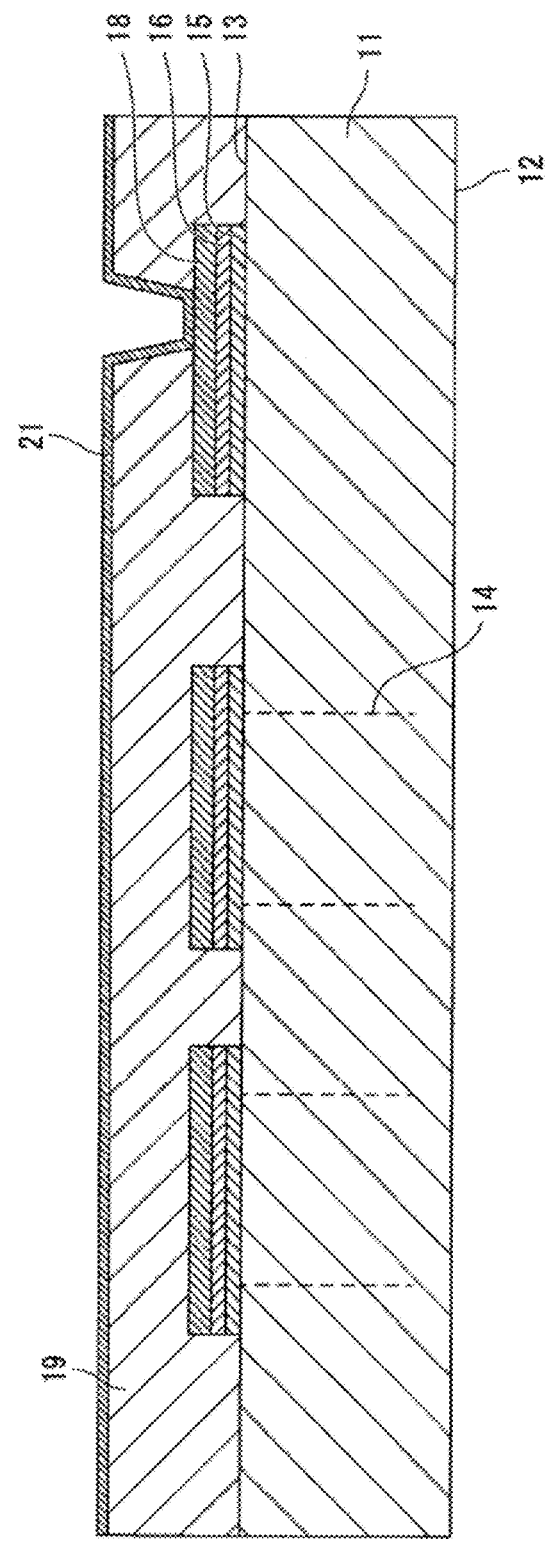

Subsequently, as shown in FIG. 12(k), a through hole 20 (a via 20 formed in the insulating resin layer) was formed in the insulating resin layer on the second surface of the glass core for electrical conduction. In this process, a laser beam machine was used and set so that the hole would be tapered with a hole diameter at the opening (the upper end in FIG. 12(k)) of 60 µm and a hole diameter at the bottom end of 45 µm. However, the processing method, the hole diameter, and the shape are not limited thereto and may be selected as required depending on the purpose. Although not shown, after the laser beam machining, desmearing was performed using a liquid that includes potassium permanganate solution as a main component. The purpose of this is to remove the resin dissolved by the laser beam machining from the bottom of the hole in order to completely expose the conductor at the bottom of the hole and to appropriately roughen the resin surface in order to improve the adhesion to a wiring seed layer described below.

Subsequently, as shown in FIG. 12(l), a copper layer 21 was laminated by an electroless plating method to form a wiring layer as a conductive seed layer on the surface of the insulating resin layer on the second surface of the glass core and on the inner wall of the hole formed in the resin layer. The thickness of the conductive seed layer was set to 500 nm. The shape, material, and processing method of the conductive seed layer are not limited thereto and may be selected as required depending on the purpose.

Figure 13A:
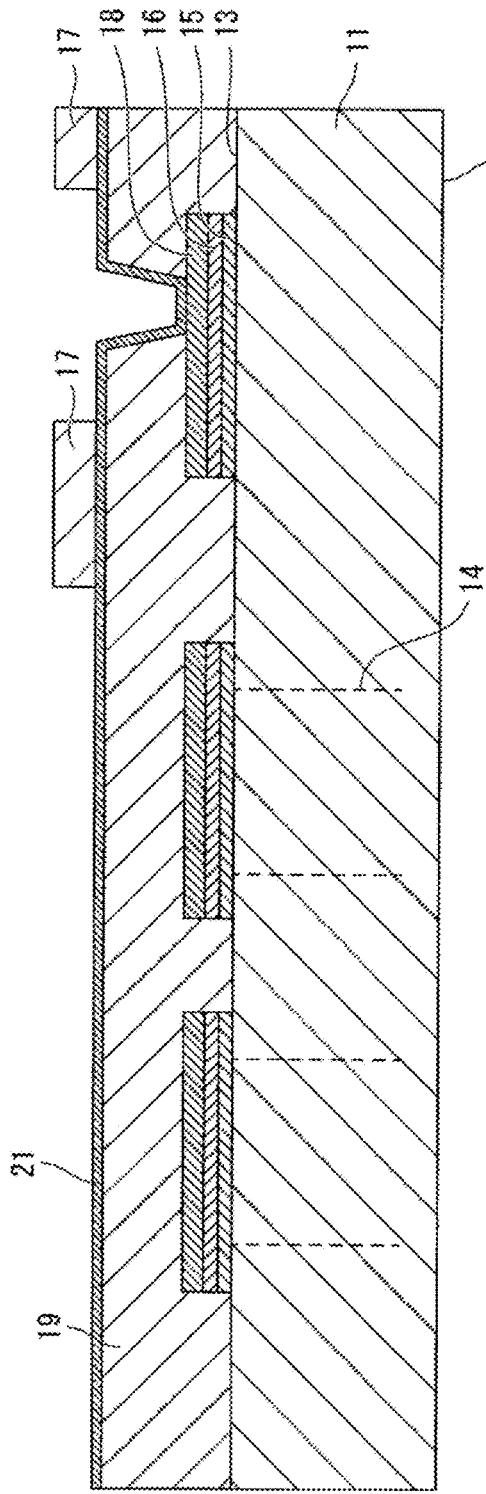
FIGS. 13(a)-13(b) are views illustrating the production process of the circuit board according to the embodiment of the present invention.
Figure 13B:
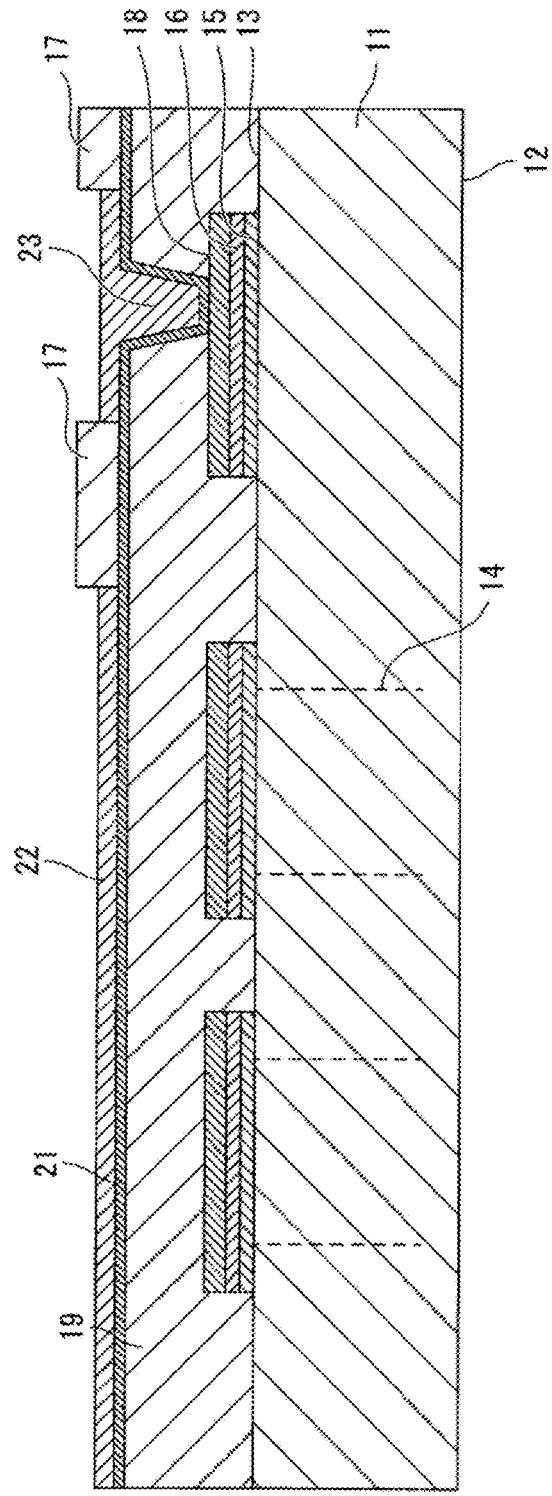

Subsequently, as shown in FIG. 13(a), the photoresist 17 was used to form a pattern on the resin layer laminated on the second surface of the glass core so that only the sections intended to be the wiring layer are exposed. Next, as shown in FIG. 13(b), an electrolytic copper plating 22 was performed on the section exposed from the photoresist pattern by electrolytic plating. The thickness of the electrolytic copper plating 22 was set to 12 µm. The thickness of the copper and the lamination method are not limited thereto and may be selected as required depending on the purpose.

After that, as shown in FIG. 14(a), the photoresist pattern was stripped and removed. Through the above processes, the section on which the wiring pattern is formed and the section on which the conductive seed layer is formed both exist on the insulating resin layer laminated on the second surface of the glass core.

Subsequently, as shown in FIG. 14(b), the conductive seed layer exposed on the insulating resin layer on the second surface of the glass core was dissolved and removed by a soft etching process. Note that, although the wiring pattern also dissolves slightly due to the soft etching process, the wiring pattern is not removed because the wiring pattern is significantly thicker than the conductive seed layer, and only the exposed conductive seed layer is removed.

Subsequently, as shown in FIGS. 15(q) and 15(r), an adhesive layer 24 was placed on the entire conductive wiring layer on the second surface of the glass core, and a carrier glass 25 was laid on top of the adhesive layer 24. Since the carrier glass 25 would be removed later on, the adhesive layer 24 was formed of material that provides temporary adhesion. The thickness of the carrier glass 25 was set to 1 mm. The carrier glass 25 is not specifically limited to a certain thickness and may be selected in accordance with ease of handling, stiffness of the substrate, and other requirements depending on the purpose.

Figure 16:
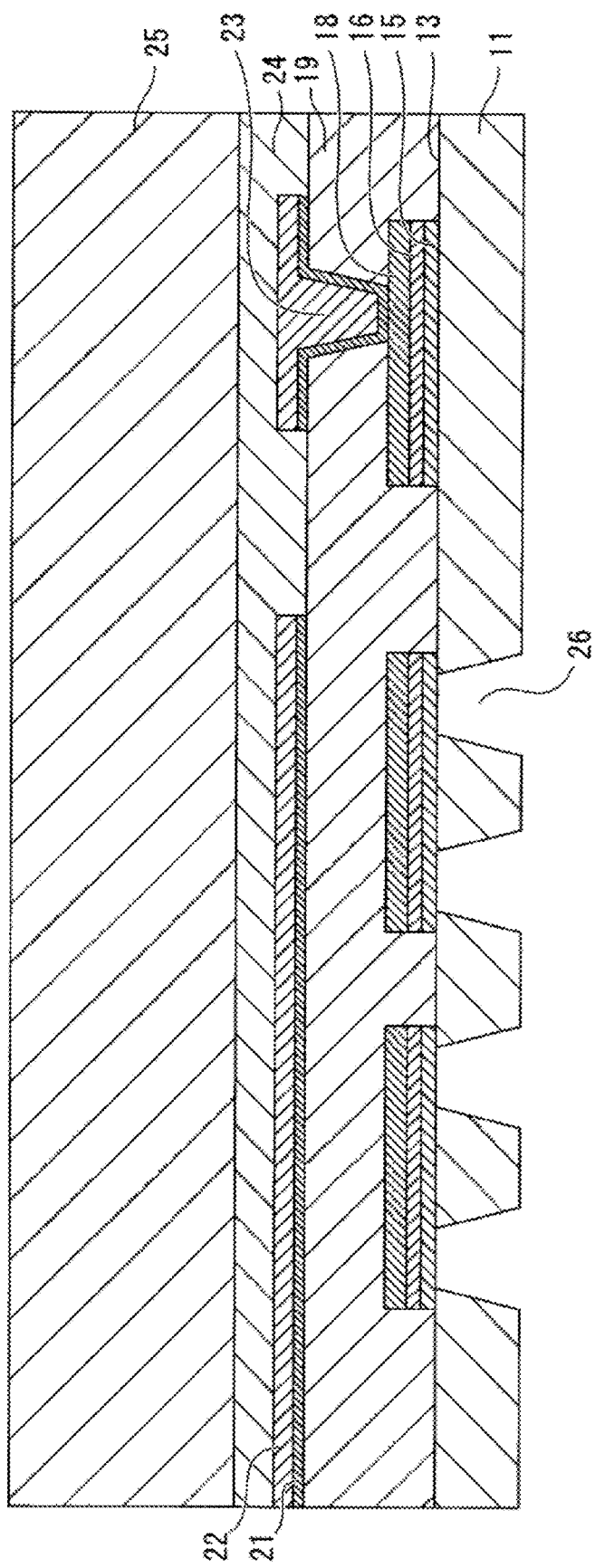
FIG. 16 is a view illustrating the production process of the circuit board according to the embodiment of the present invention.

Subsequently, as shown in FIG. 16, the substrate was subjected to hydrofluoric acid etching to reduce the thickness from the first surface of the glass core 11. Since the entire first surface of the glass core is equally made thinner by adjusting the processing conditions, the glass of the glass core is made thinner, parallel to the second surface, until etching reaches the modified sections inside the glass core. Once the etching reaches the modified sections, it appears as if the glass is made thinner while holes are being formed in the glass since the etching rate at the modified sections is high. The optimal conditions for hydrofluoric acid etching of the glass were adjusted in advance, so that when the glass thickness reaches 200 µm, through holes are formed in the glass core with a hole diameter of 90 µm on the first surface and 70 µm on the second surface.

Figure 17:
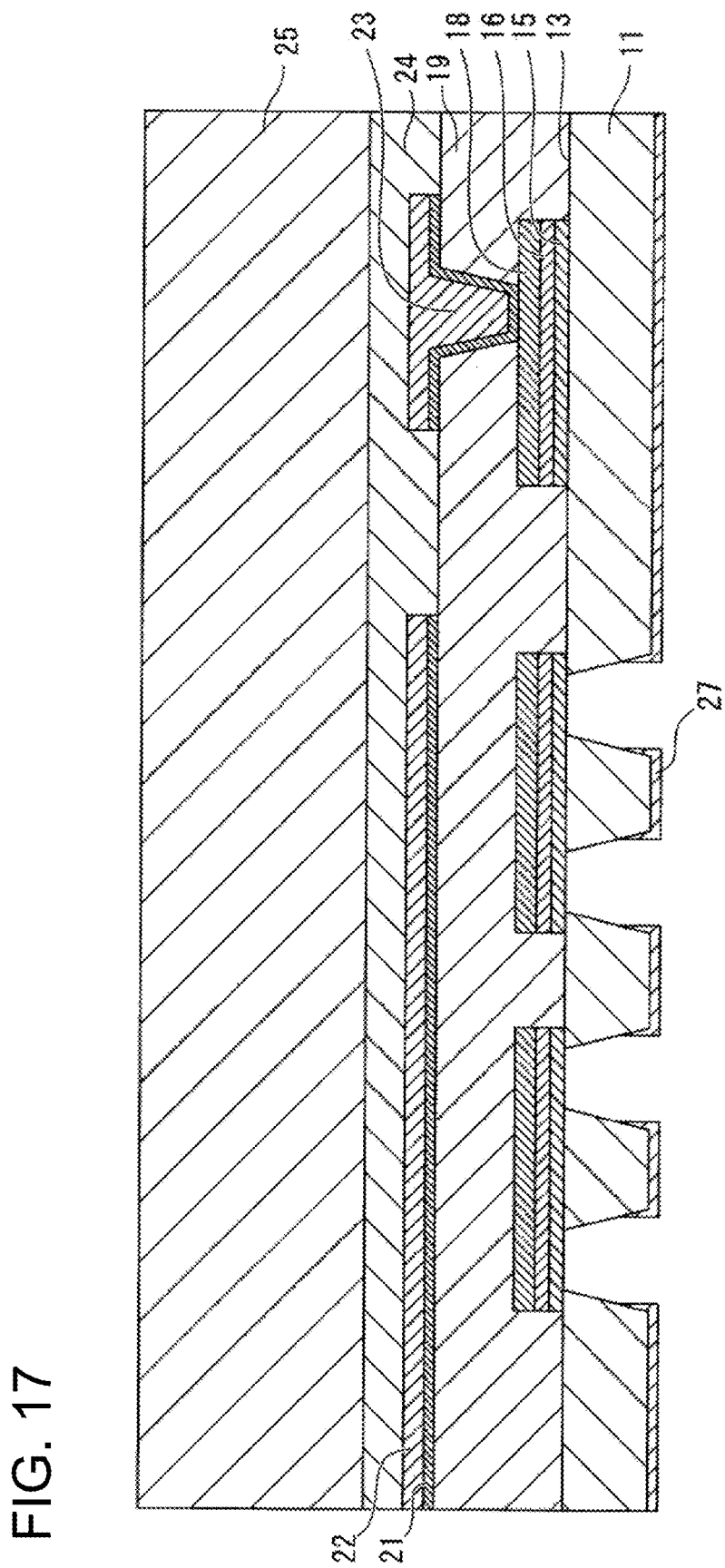
FIG. 17 is a view illustrating the production process of the circuit board according to the embodiment of the present invention.
Figure 18:
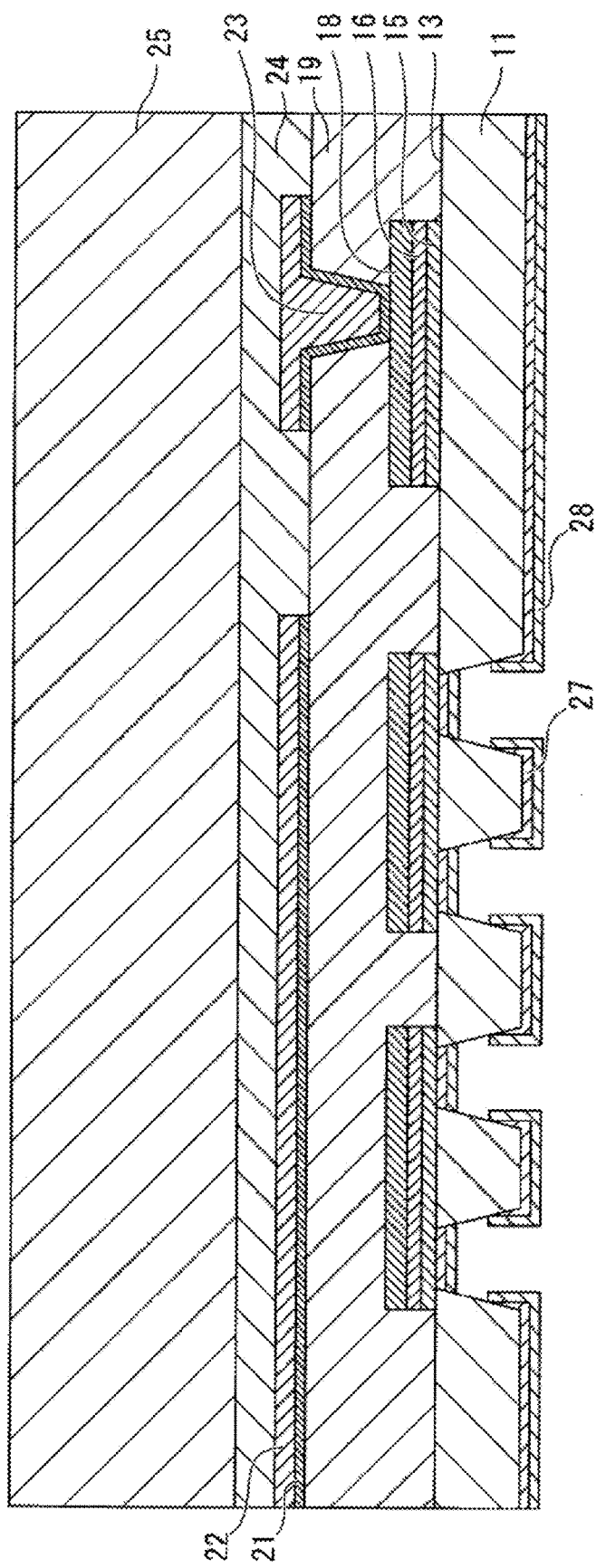
FIG. 18 is a view illustrating the production process of the circuit board according to the embodiment of the present invention.
Figure 19:
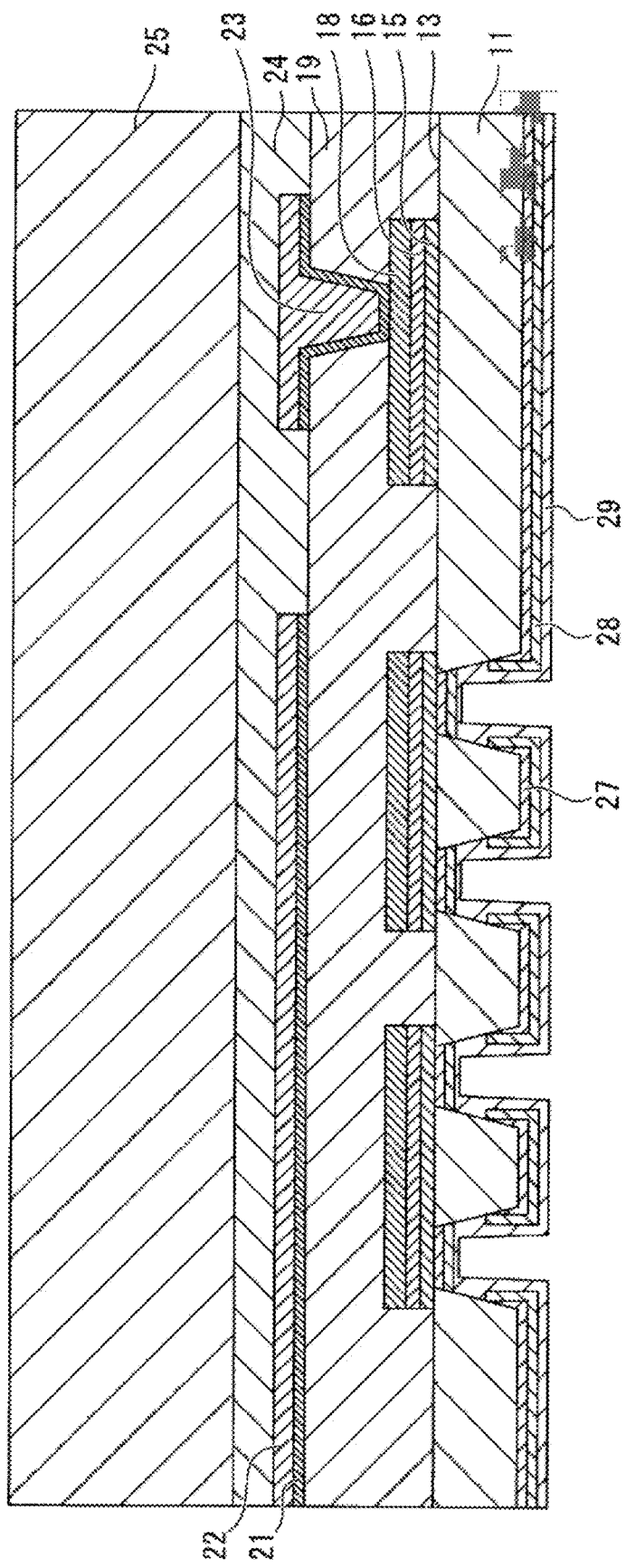
FIG. 19 is a view illustrating the production process of the circuit board according to the embodiment of the present invention.

Subsequently, as shown in FIGS. 17 and 18, a titanium layer 27 and a copper layer 28, which serve as the first layer, are laminated in this order on the surface of the first surface of the glass core including the inner walls of the holes. The lamination was performed by sputtering, and the thickness of the titanium layer was set to 50 nm, while the thickness of the copper layer was set to 300 nm. It had been confirmed by the investigation of optimal conditions in advance that when a film is formed under the set conditions, the film is formed on the inner walls of the holes up to about 50 nm from the opening of the holes on the side walls, and is formed on the bottoms of the holes in the same manner as the surface that is not the holes.

Subsequently, as shown in FIG. 19(v), a nickel layer 29, which serves as the second layer, was laminated on the surface of the first surface of the glass core and on the inside of the holes by electroless plating. The thickness of the nickel was set to 200 nm.

Figure 20:
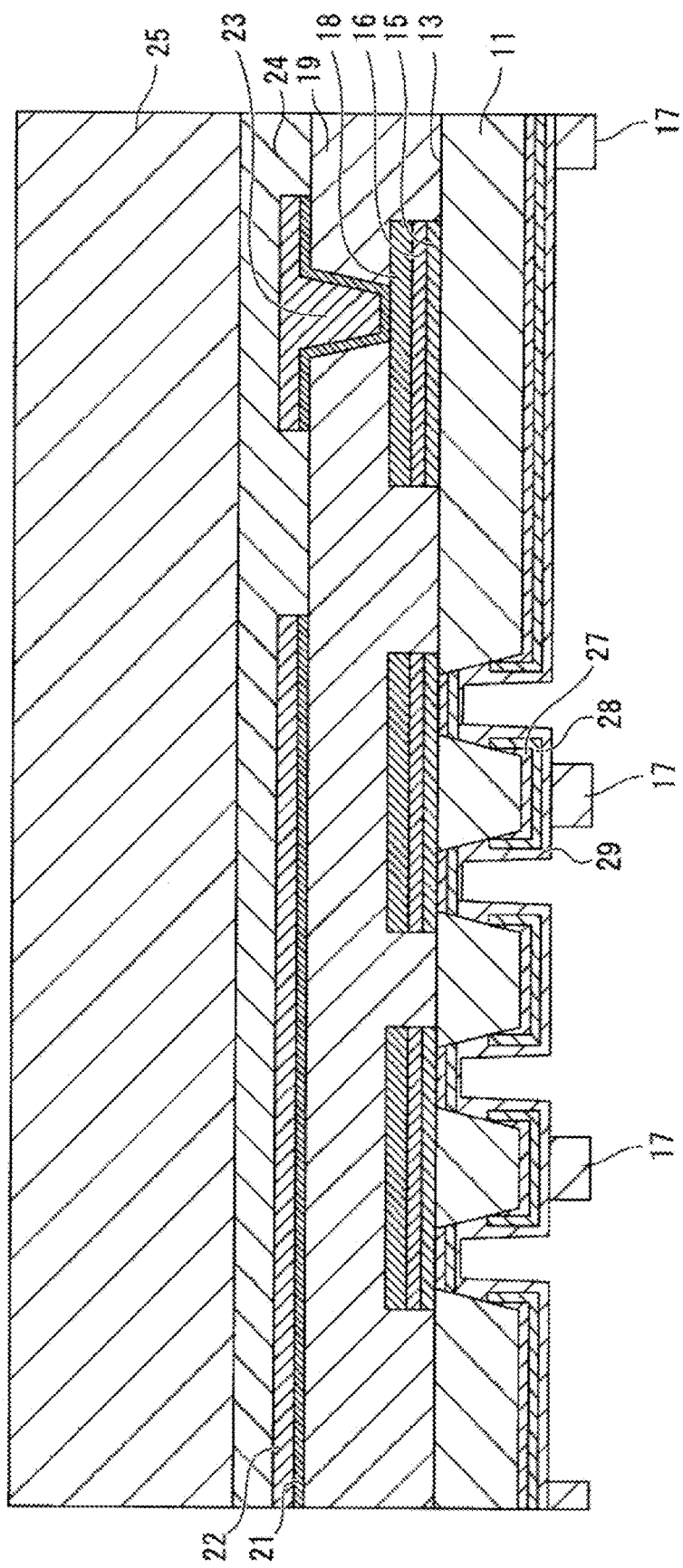
FIG. 20 is a view illustrating the production process of the circuit board according to the embodiment of the present invention.

Subsequently, as shown in FIG. 20, a photoresist layer 17 was formed on the first surface of the glass core, and photolithographic patterning was performed so that the sections that are intended to be the wiring pattern later are exposed.

Figure 21:
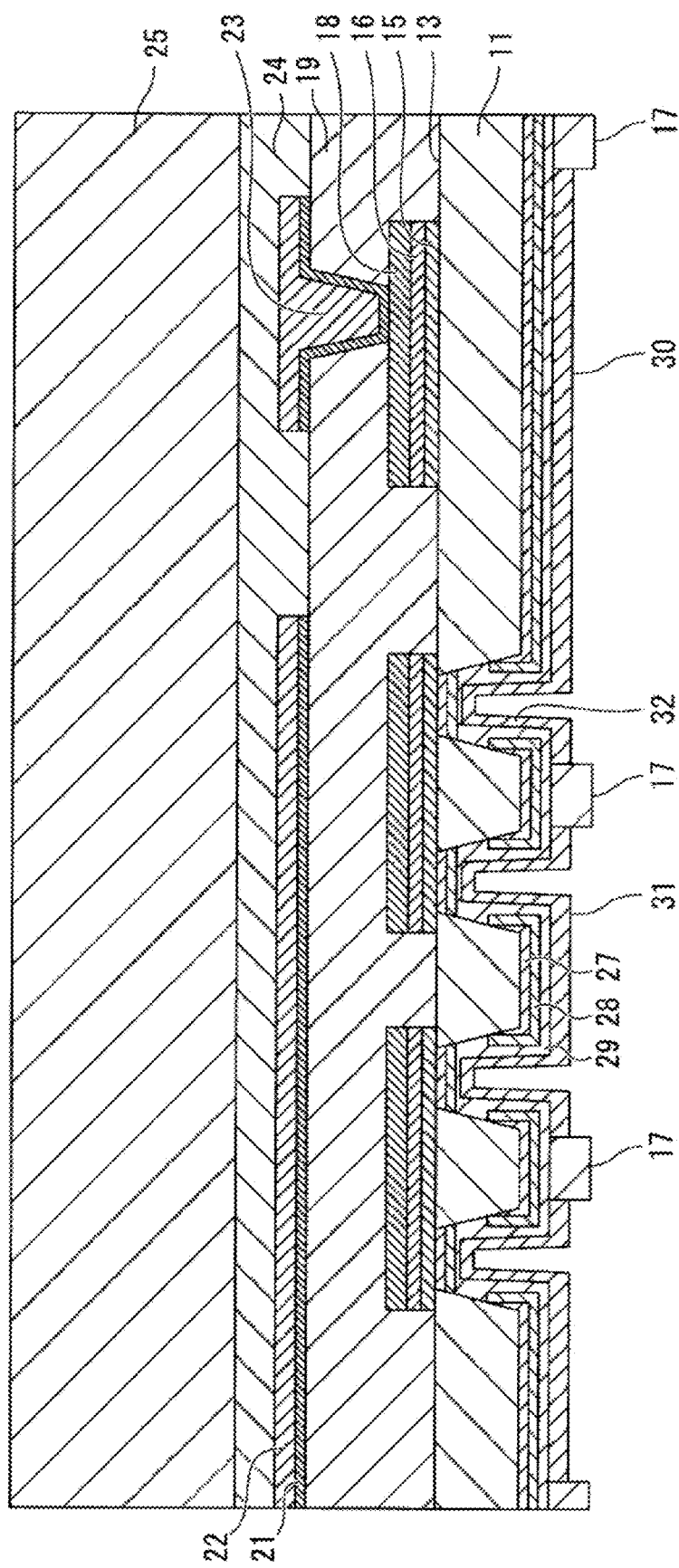
FIG. 21 is a view illustrating the production process of the circuit board according to the embodiment of the present invention.

Subsequently, as shown in FIG. 21, copper 30 to 32 were laminated by electrolytic plating on the sections of the photoresist pattern on the first surface of the glass core where the resist is removed so that the base is exposed. The conditions were set in advance with the target value of the thickness of the copper being 12 µm.

Figure 22:
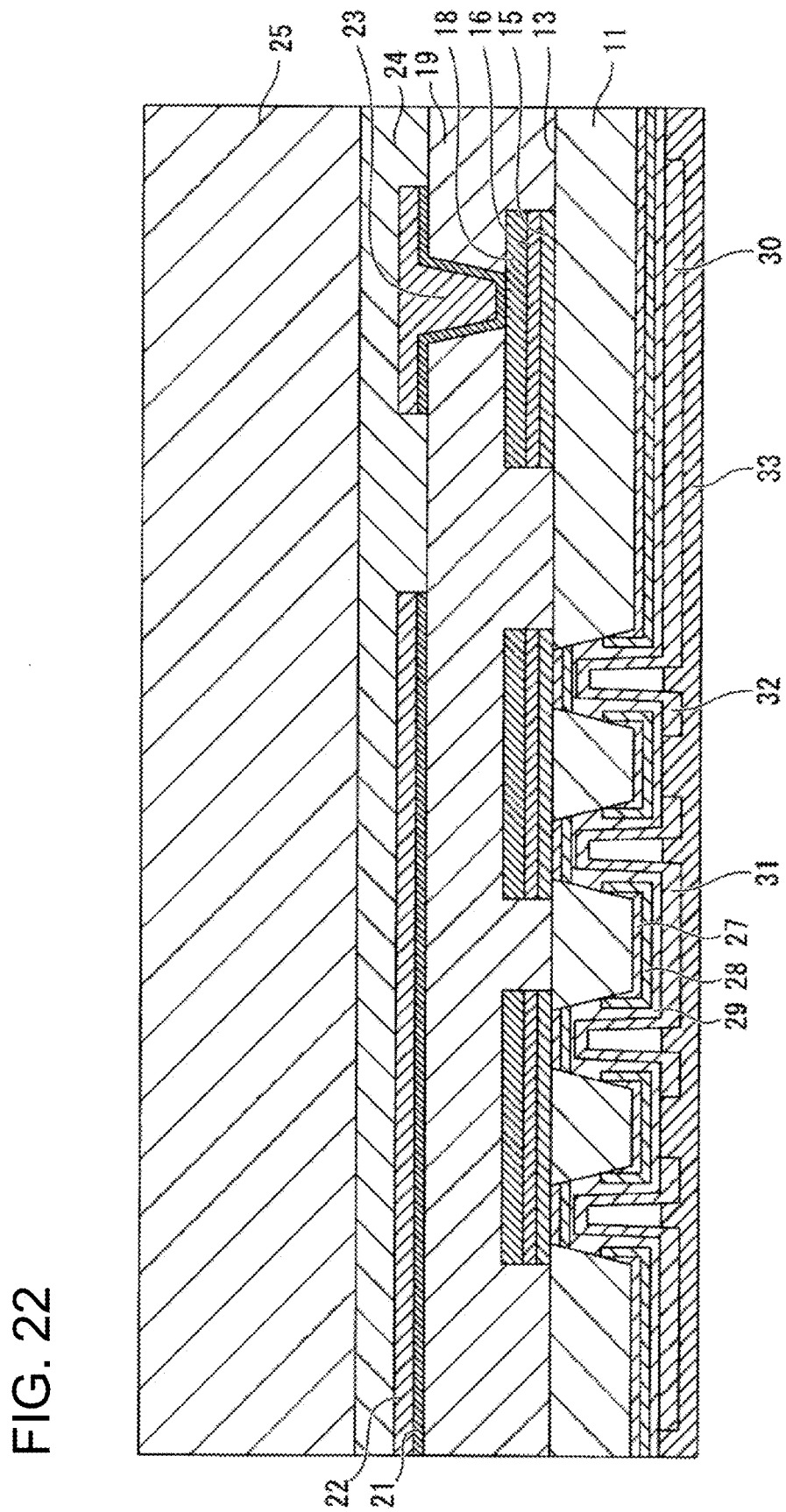
FIG. 22 is a view illustrating the production process of the circuit board according to the embodiment of the present invention.

Subsequently, as shown in FIG. 22, a dielectric layer 33 which is sandwiched between the electrodes of the capacitor embedded in the multilayer substrate was formed. The order of processing was to first form the dielectric layer 33 on the entire top surface of the first surface of the glass core, then to remove the unnecessary sections later. Aluminum nitride was selected as the dielectric and was laminated by sputtering to have a thickness of 200 nm.

Figure 23:
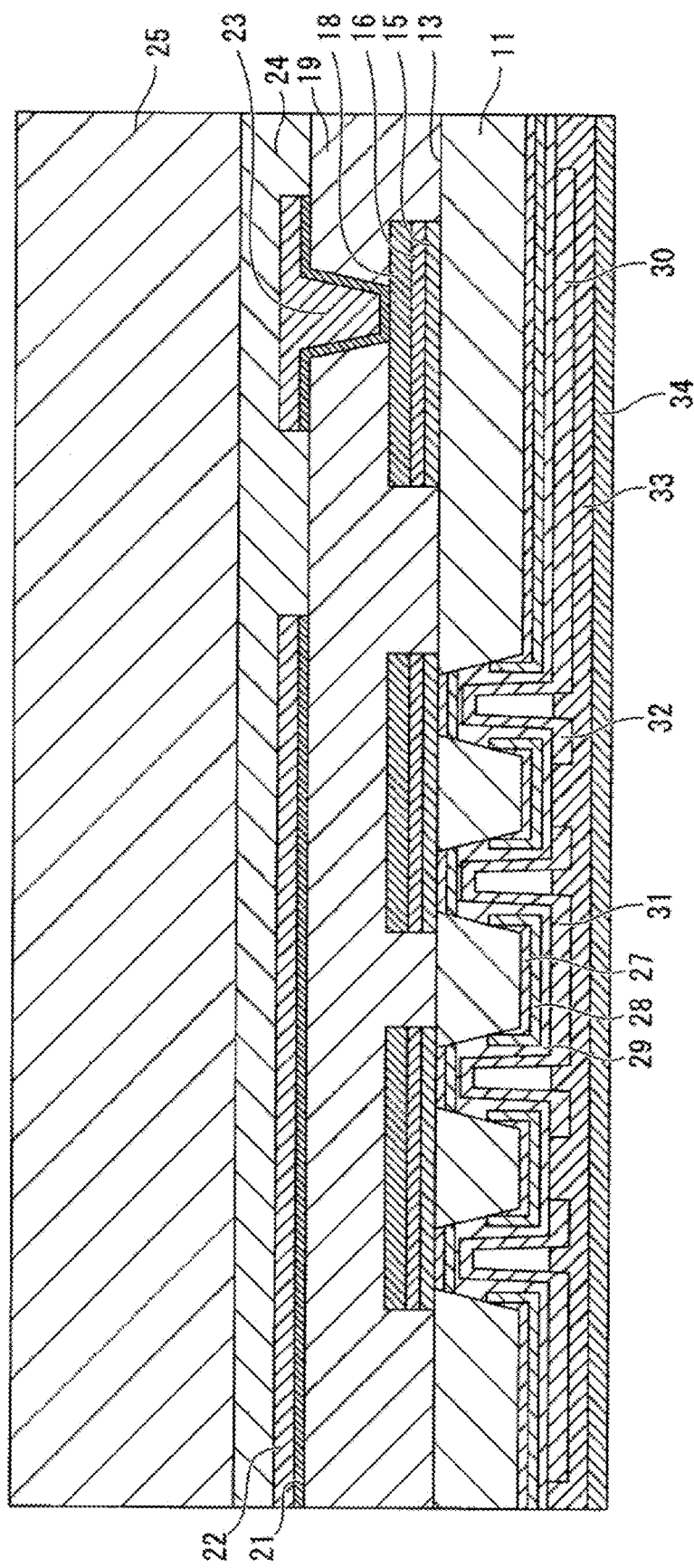
FIG. 23 is a view illustrating the production process of the circuit board according to the embodiment of the present invention.

Subsequently, as shown in FIG. 23, a titanium layer 34 was formed on the entire upper surface of the dielectric layer. This has a role of a cohesive layer for forming the upper electrode of the capacitor in the following step. The thickness of lamination was set to 50 nm, and sputtering was selected as the lamination method.

Figure 24:
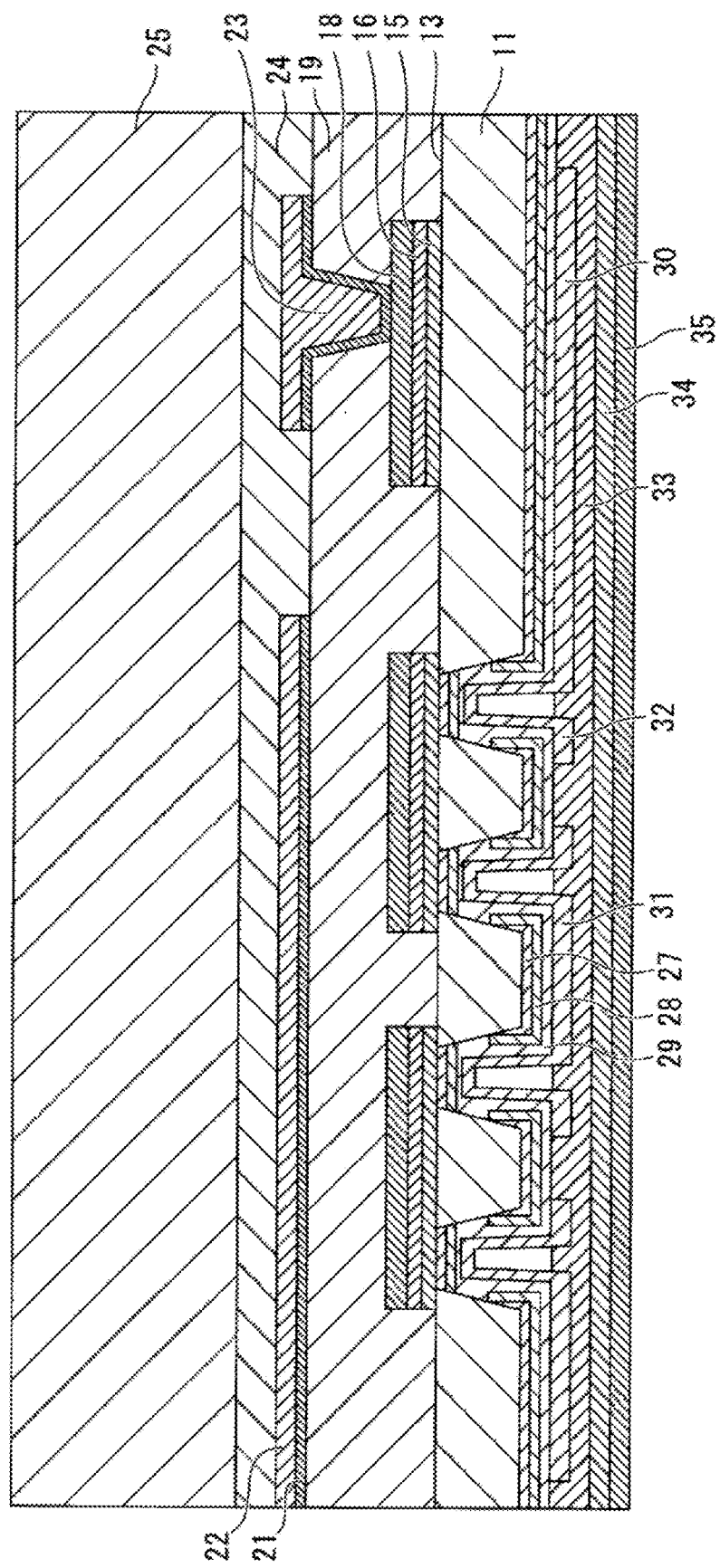
FIG. 24 is a view illustrating the production process of the circuit board according to the embodiment of the present invention.

Subsequently, as shown in FIG. 24, a copper layer 35 was laminated on the entire surface of the titanium layer, which is the top layer on the first surface of the glass core. This serves as a conductive seed for later electrolytic copper plating of copper. The thickness of lamination was set to 300 nm, and sputtering was selected as the lamination method.

Figure 25:
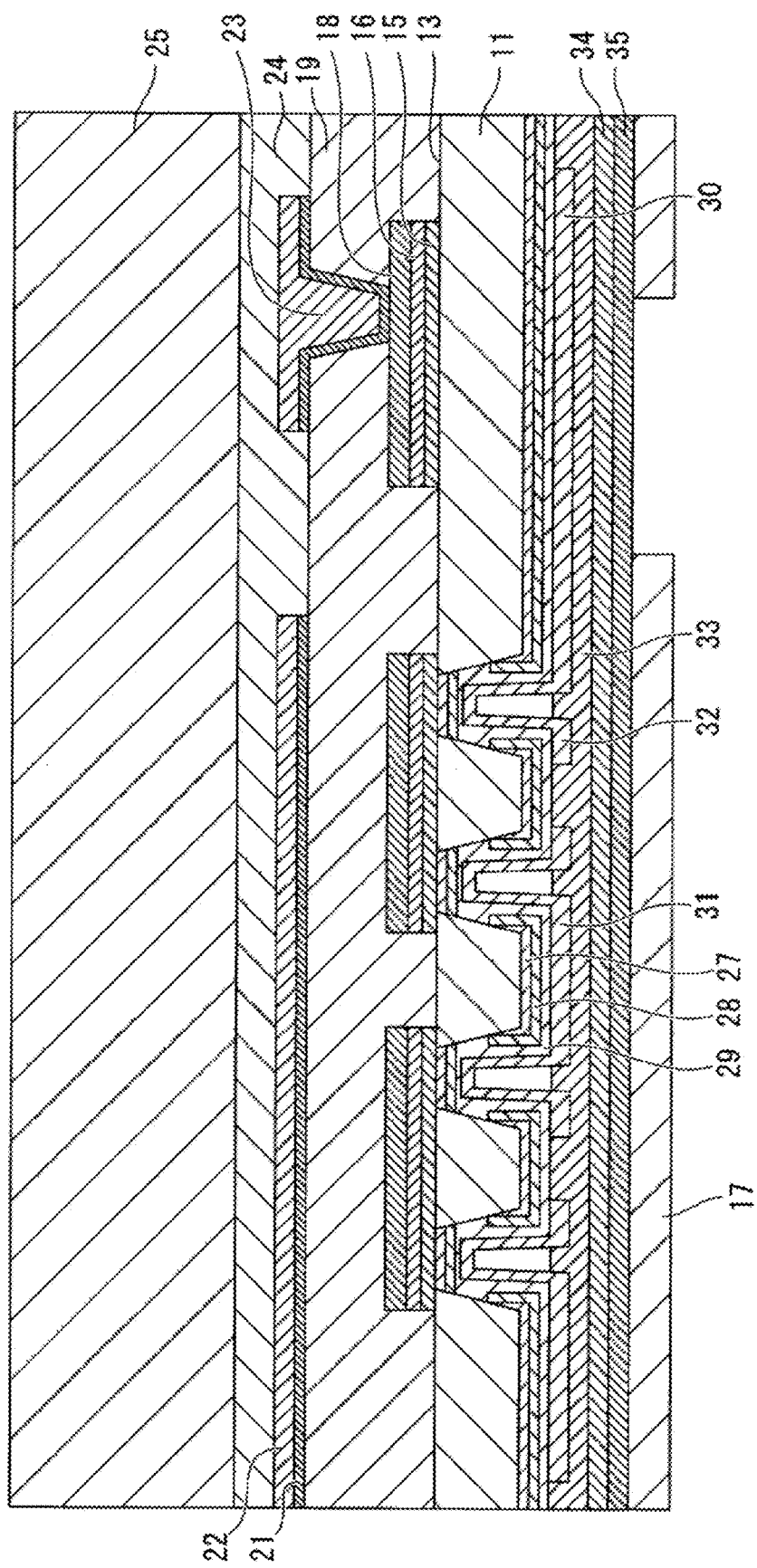
FIG. 25 is a view illustrating the production process of the circuit board according to the embodiment of the present invention.

Subsequently, as shown in FIG. 25, the photoresist layer 17 was formed on the sputtered copper layer at the top layer on the first surface of the glass core. The photoresist layer 17 was patterned by subsequent photolithography by removing the photoresist of the section that forms the upper electrode of the capacitor through the electrolytic copper plating afterwards.

Figure 26:
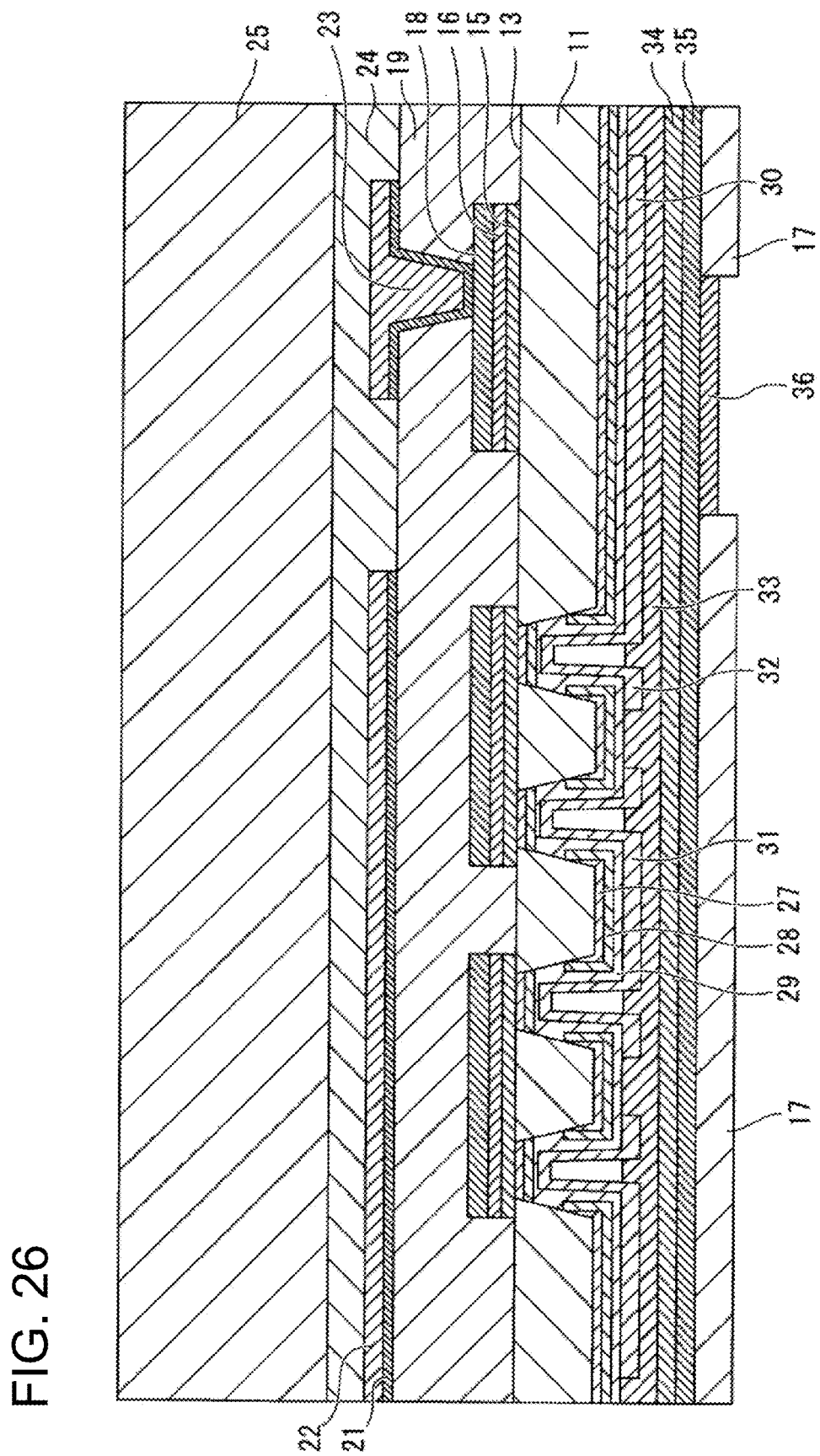
FIG. 26 is a view illustrating the production process of the circuit board according to the embodiment of the present invention.
Figure 27:
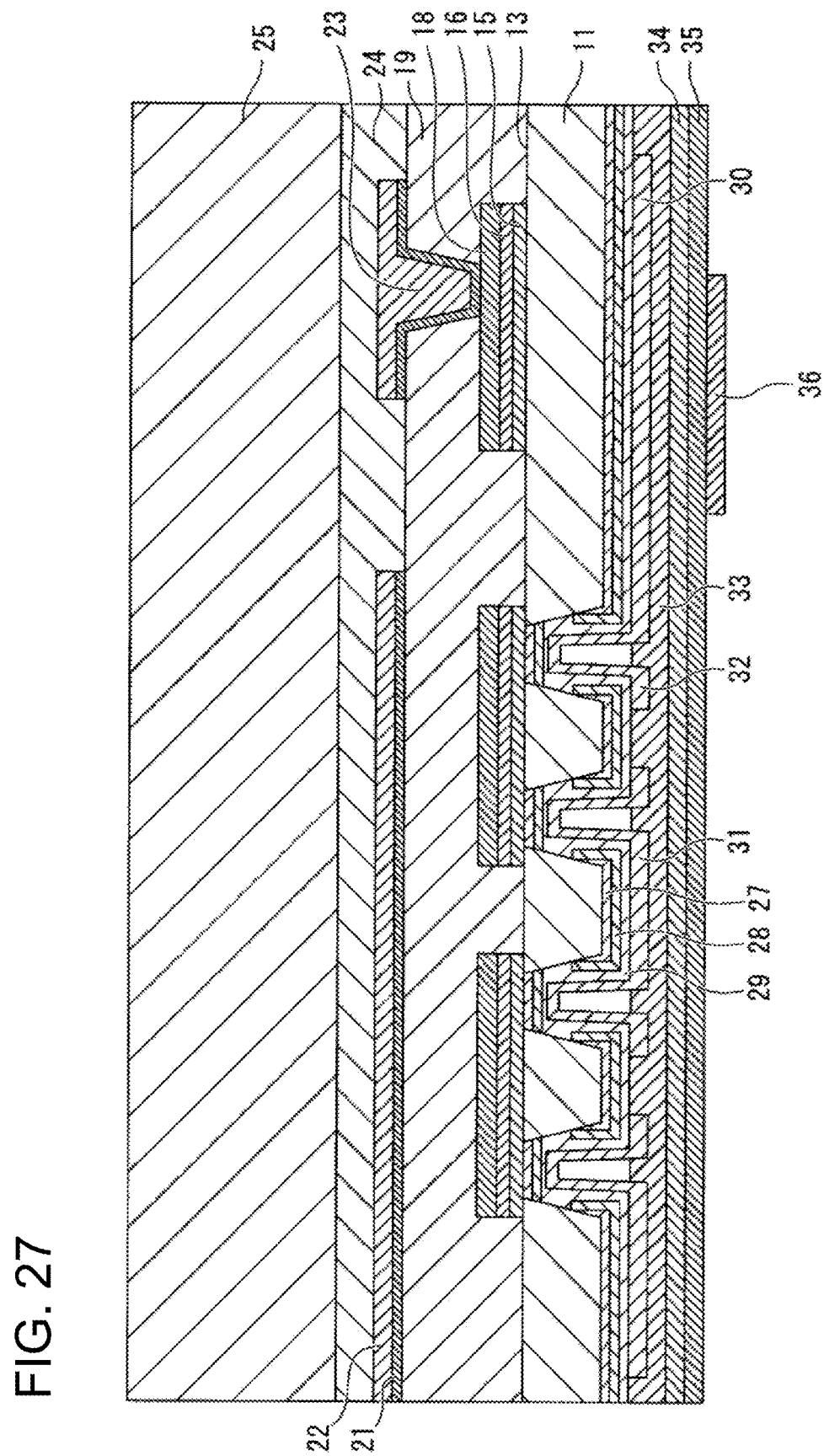
FIG. 27 is a view illustrating the production process of the circuit board according to the embodiment of the present invention.

Subsequently, as shown in FIG. 26, a capacitor upper electrode 36 was formed by subjecting the first surface of the glass core to electrolytic copper plating. The thickness of the plating was set to 8 µm. After electrolytic plating, the photoresist layer 17, which formed the resist pattern, was stripped off, as shown in FIG. 27. At this step, unnecessary layers are laminated on the first surface of the glass core except the section where the capacitor upper electrode is formed. An extra dielectric layer, titanium layer, and copper layer are laminated on the section of the first surface of the glass core where the wiring pattern is formed, and an extra titanium layer, copper layer, nickel layer, dielectric layer, titanium layer, and copper layer are laminated in this order on the surface of the glass at the section of the first surface of the glass core without the wiring pattern. Such extra layers are sequentially removed in the following steps.

Figure 28:
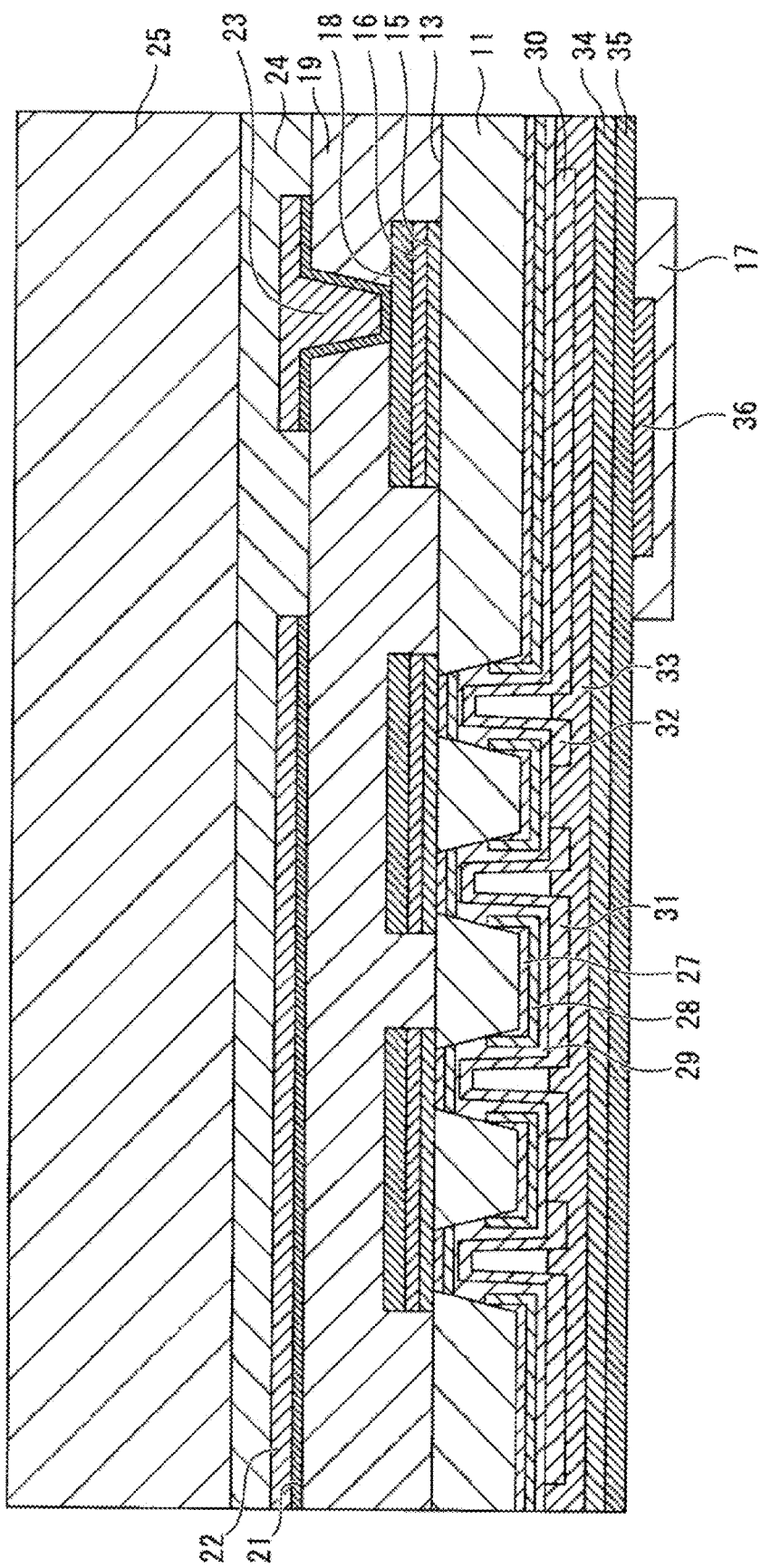
FIG. 28 is a view illustrating the production process of the circuit board according to the embodiment of the present invention.

First, as shown in FIG. 28, the capacitor upper electrode 36, the dielectric layer 33 below the capacitor upper electrode 36, and the capacitor lower electrode 30 were covered with the photoresist 17 so as to protect them from being removed together in the process of removing unnecessary layers later.

Figure 29:
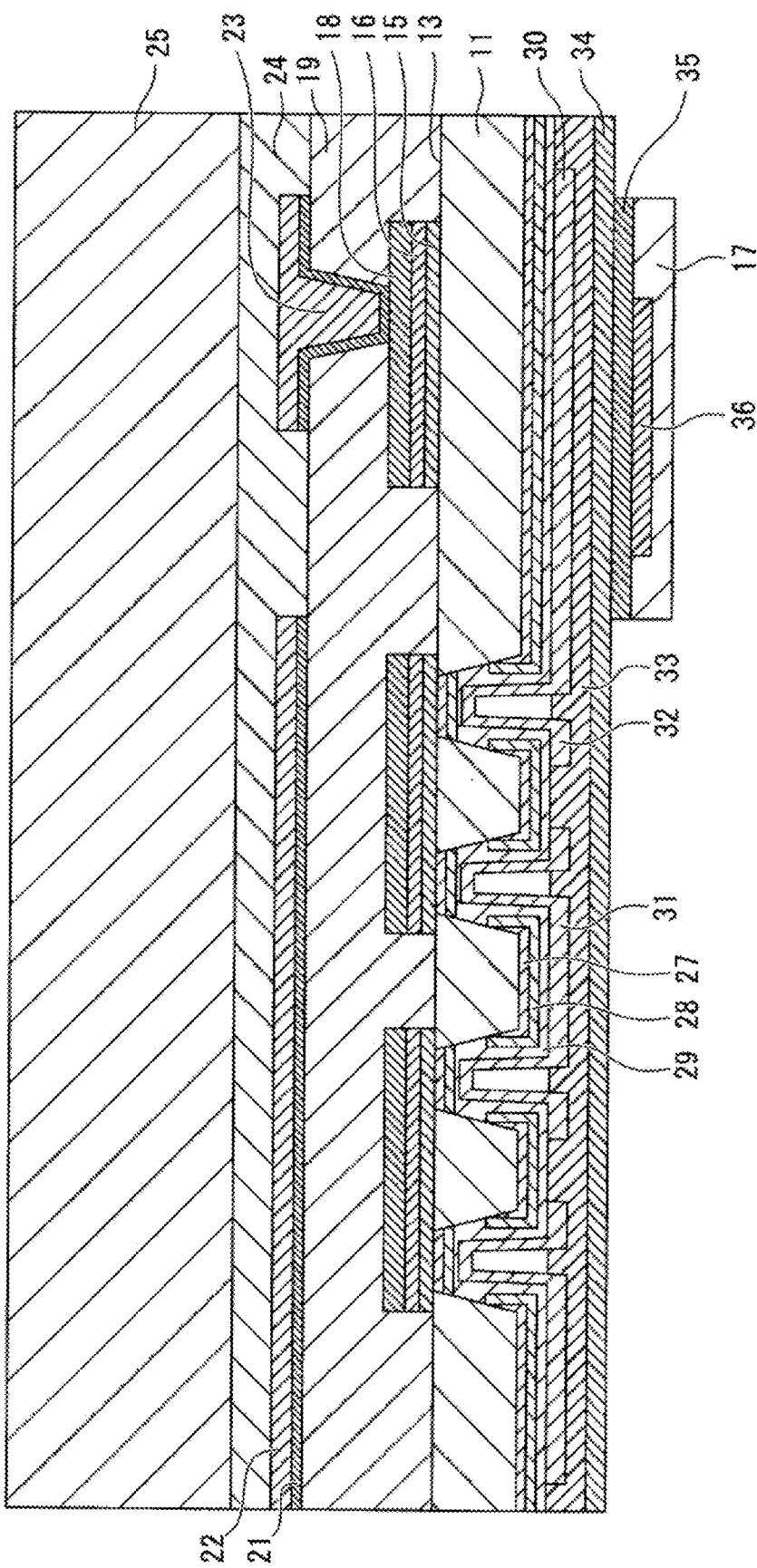
FIG. 29 is a view illustrating the production process of the circuit board according to the embodiment of the present invention.

Subsequently, as shown in FIG. 29, the copper layer 35 formed by sputtering and located at the top of the unnecessary layers was removed by soft etching.

Figure 30:
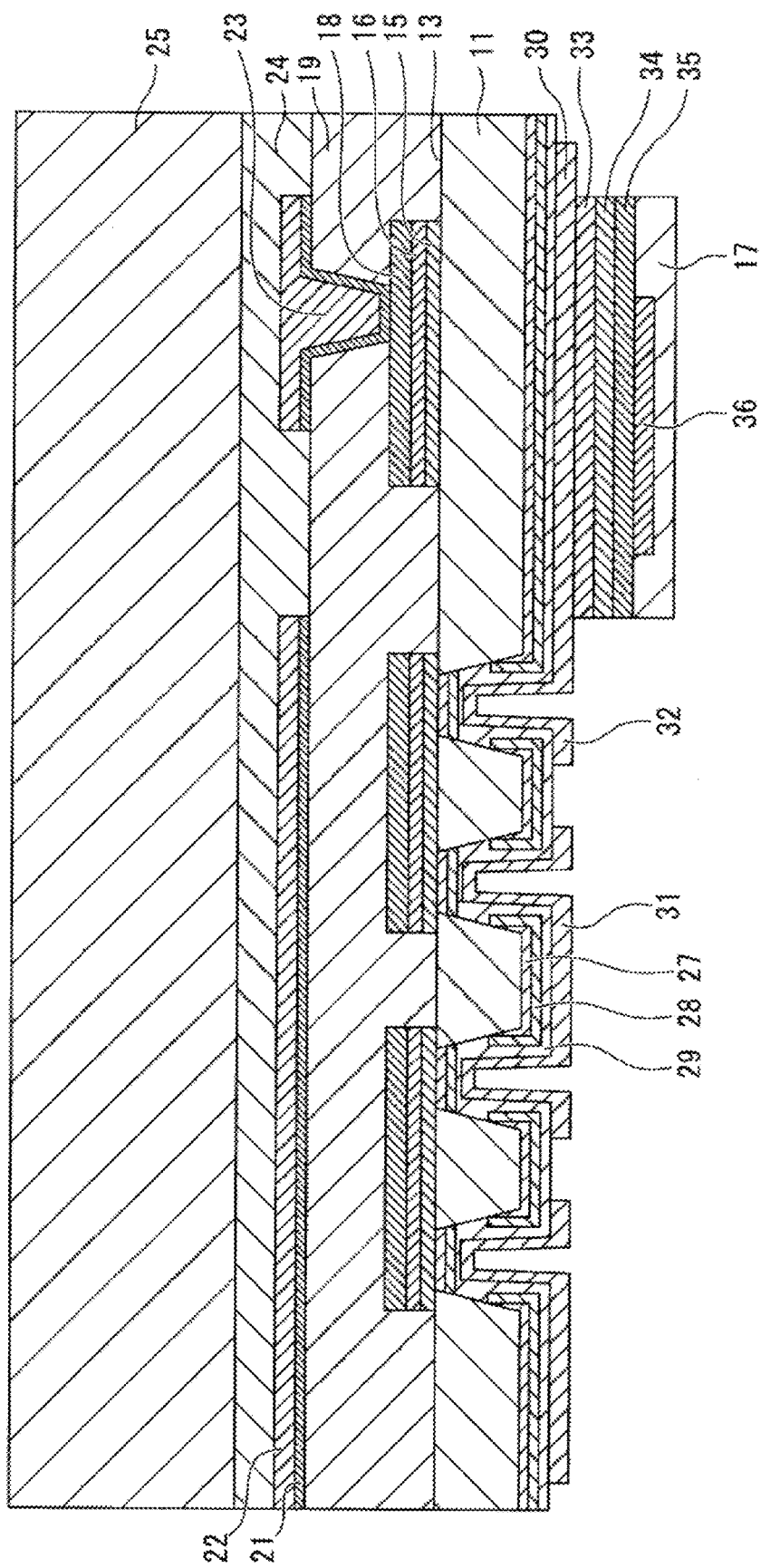
FIG. 30 is a view illustrating the production process of the circuit board according to the embodiment of the present invention.

Subsequently, as shown in FIG. 30, the regions of the titanium layer 34 and the underneath dielectric layer 33 formed of aluminum nitride where the photoresist 17 was not formed were removed. Dry etching method was selected as the method, but the method is not limited thereto and may be freely selected as required.

Figure 31:
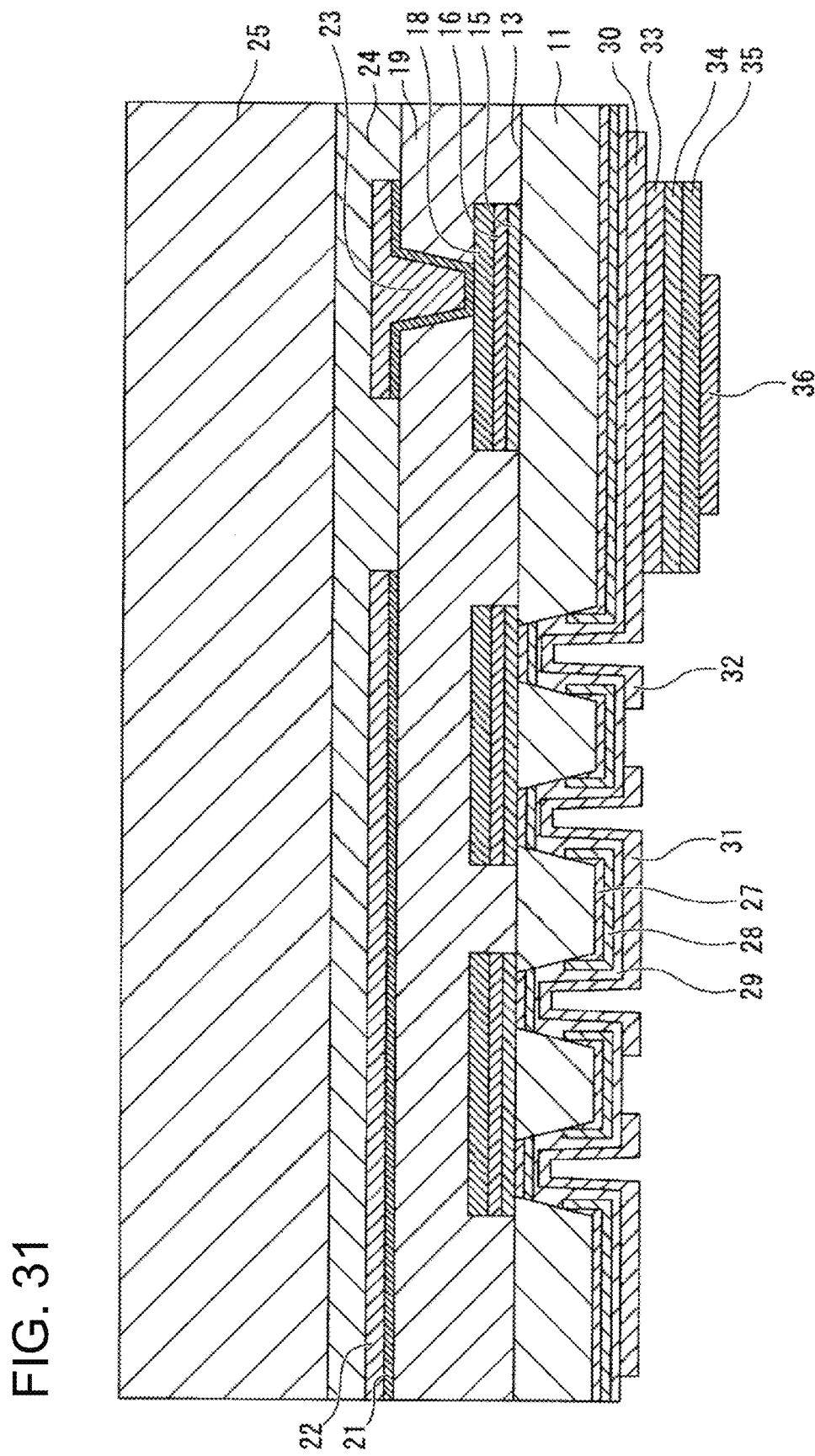
FIG. 31 is a view illustrating the production process of the circuit board according to the embodiment of the present invention.

Subsequently, as shown in FIG. 31, the photoresist 17, which covers the capacitor, was removed. This is because in the subsequent process of removing the unnecessary layers, the copper layer forming the wiring pattern plays the role of protecting itself and the layer below the copper layer.

Figure 32:
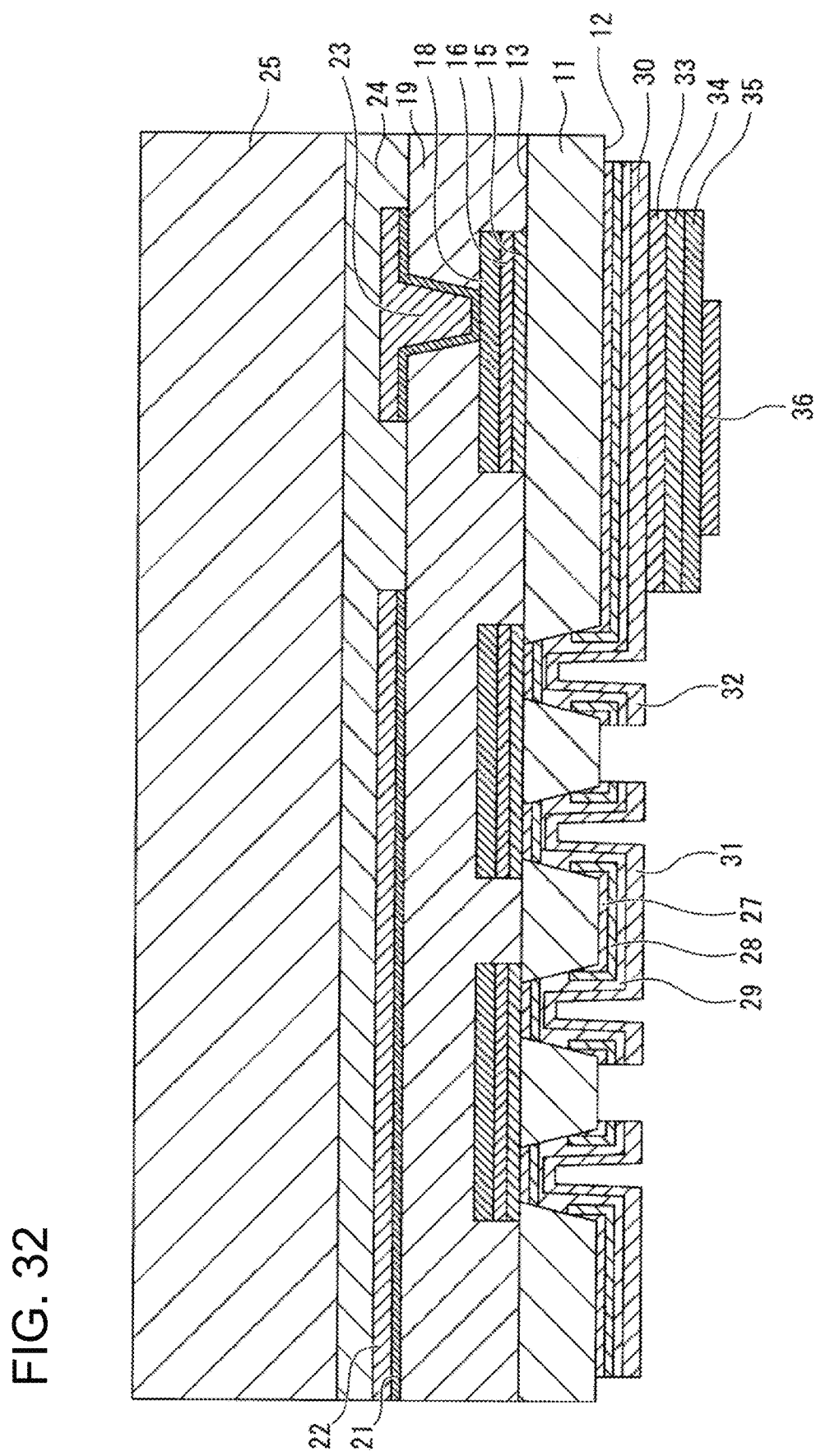
FIG. 32 is a view illustrating the production process of the circuit board according to the embodiment of the present invention.

Subsequently, as shown in FIG. 32, the unnecessary nickel layer 29, copper layer 28, and titanium layer 27 were sequentially removed. The method includes using different chemical solutions having selective corrosivity to each layer, but the chemical solutions are not specifically restricted to the above. For example, a chemical solution that can simultaneously remove a plurality of layers may also be used.

Figure 33:
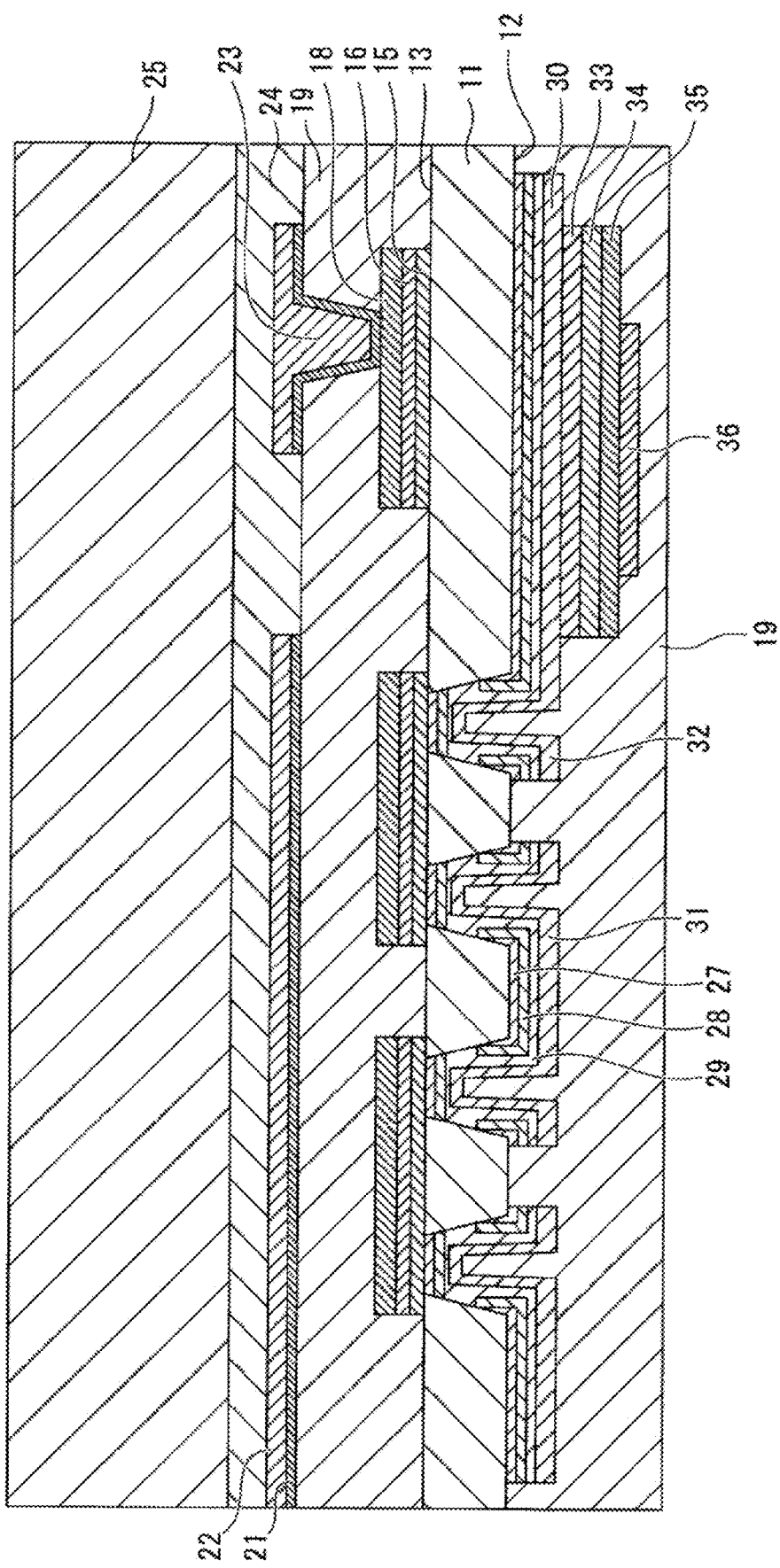
FIG. 33 is a view illustrating the production process of the circuit board according to the embodiment of the present invention.

Subsequently, as shown in FIG. 33, an insulating resin layer 19 was formed by laminating the insulating resin sheet on the first surface of the glass core. In the example, an insulating resin produced by Ajinomoto Fine-Techno Co., Inc. (product name: ABF-GX-T31R) was used as the insulating resin sheet and was laminated by a vacuum press laminator, but it is not necessarily limited thereto. The insulating resin sheet may be selected as required. The thickness of the insulating resin sheet was set to 25 µm. In this regard, a thickness sufficient to completely cover the wiring layer on the first surface of the glass core and the capacitor is required. In the case of the example, since the thickness from the surface of the first surface of the glass core to the capacitor upper electrode is approximately 21 µm including the base layers, it was determined that 25 µm was sufficient for the thickness of the insulting resin sheet.

Figure 34:
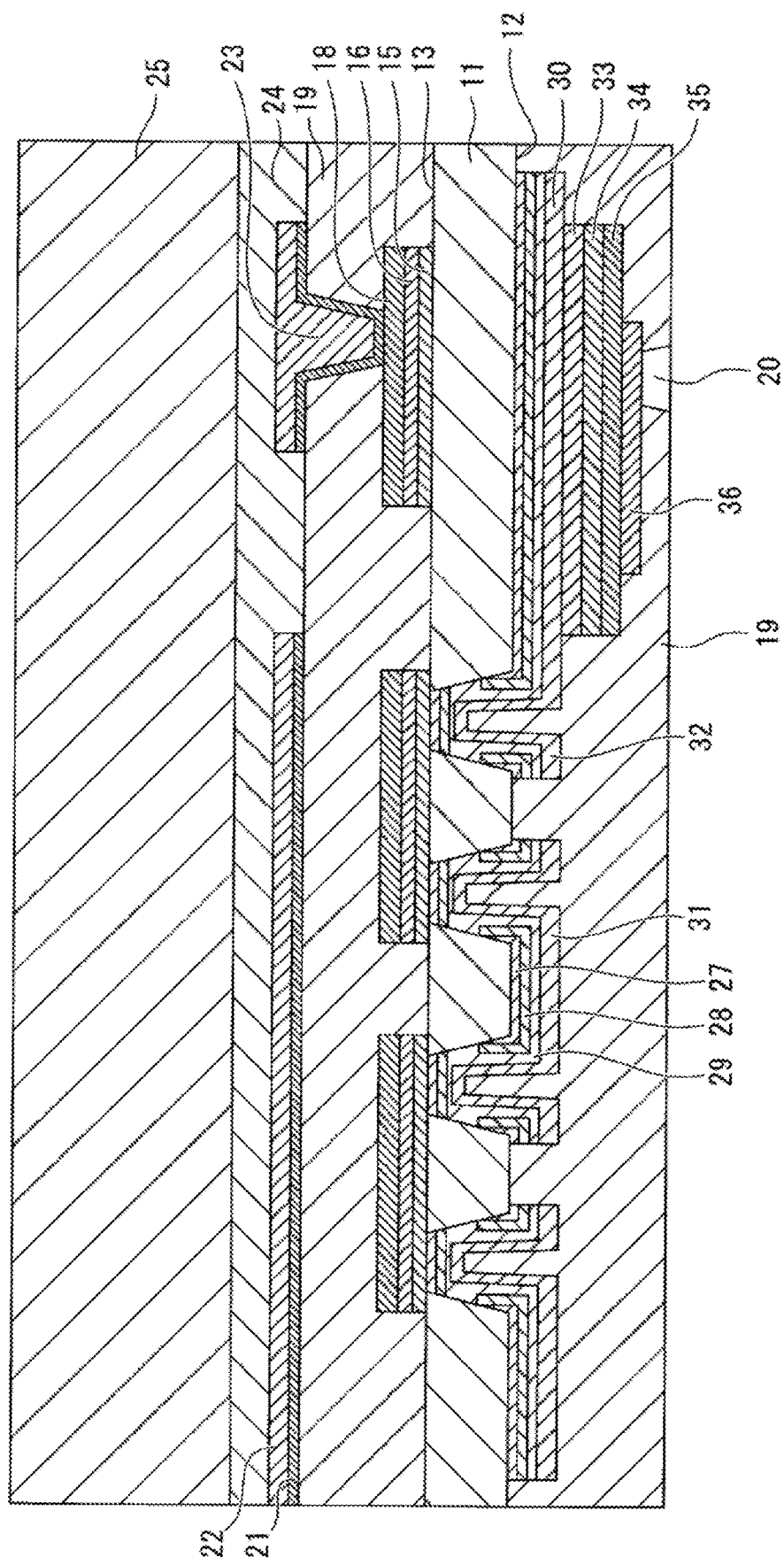
FIG. 34 is a view illustrating the production process of the circuit board according to the embodiment of the present invention.

Subsequently, as shown in FIG. 34, a through hole 20 was formed for electrical conduction in the insulating resin layer 19 on the first surface of the glass core. In this process, a laser beam machine was used and set so that the hole would be tapered with a hole diameter at the opening of 60 µm and a hole diameter at the bottom end of 45 µm. However, the processing method, the hole diameter, and the shape are not limited thereto and may be selected as required depending on the purpose. Although not shown, after the laser beam machining, desmearing was performed using a liquid that contains a potassium permanganate solution as a main component. The purpose of this is to remove the resin dissolved by the laser beam machining from the bottom of the hole in order to completely expose the conductor at the bottom of the hole and to appropriately roughen the resin surface in order to improve the adhesion to a wiring seed layer described below.

Figure 35:
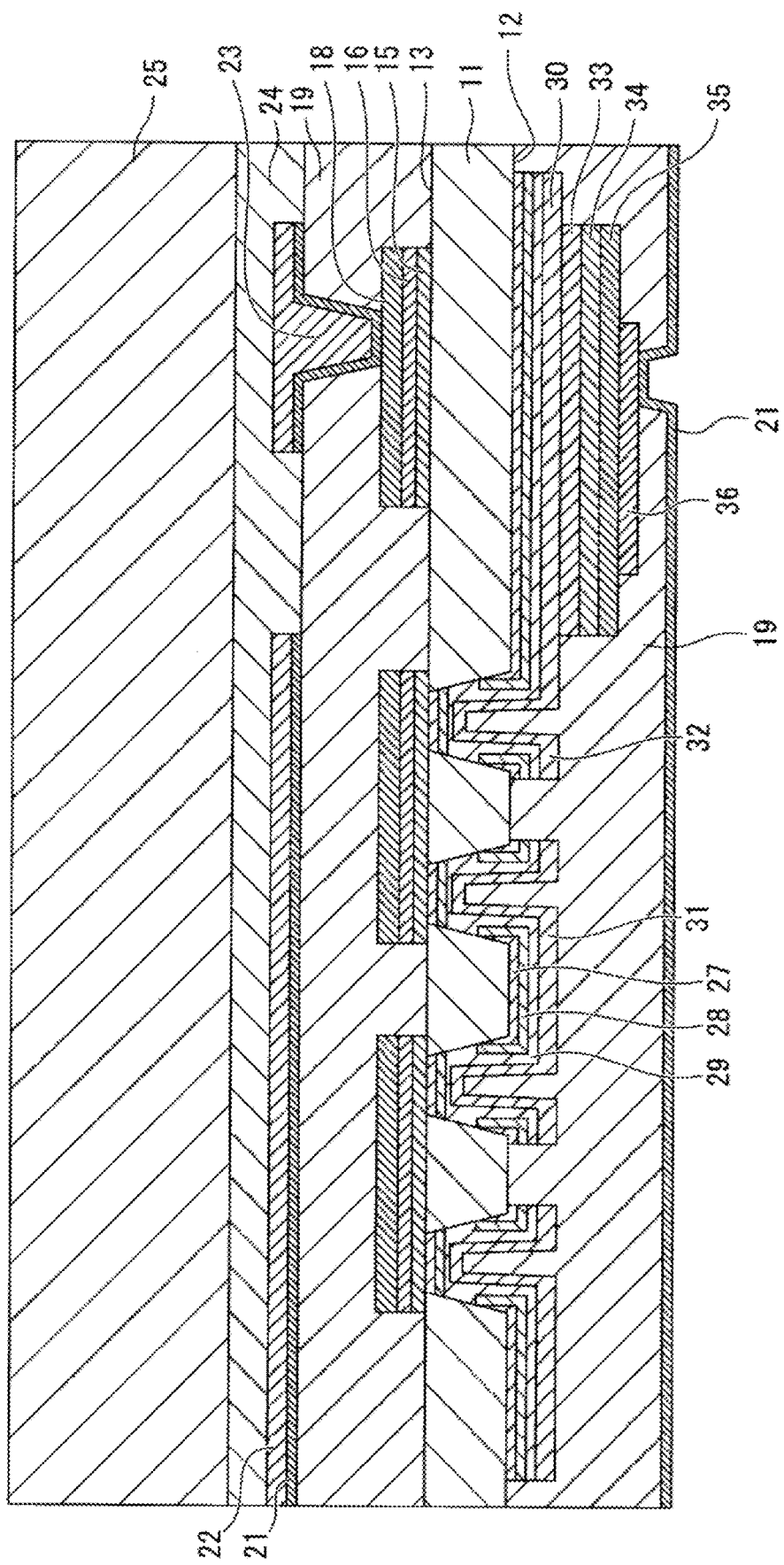
FIG. 35 is a view illustrating the production process of the circuit board according to the embodiment of the present invention.

Subsequently, as shown in FIG. 35, a copper layer 21 was laminated on the surface of the insulating resin layer 19 on the first surface of the glass core and on the inner wall of the hole formed in the resin layer as the conductive seed layer by an electroless plating method to form a wiring layer. The thickness of the conductive seed layer was set to 500 nm. The shape, material, and processing method of the conductive seed layer are not limited thereto and may be selected as required depending on the purpose.

Figure 36:
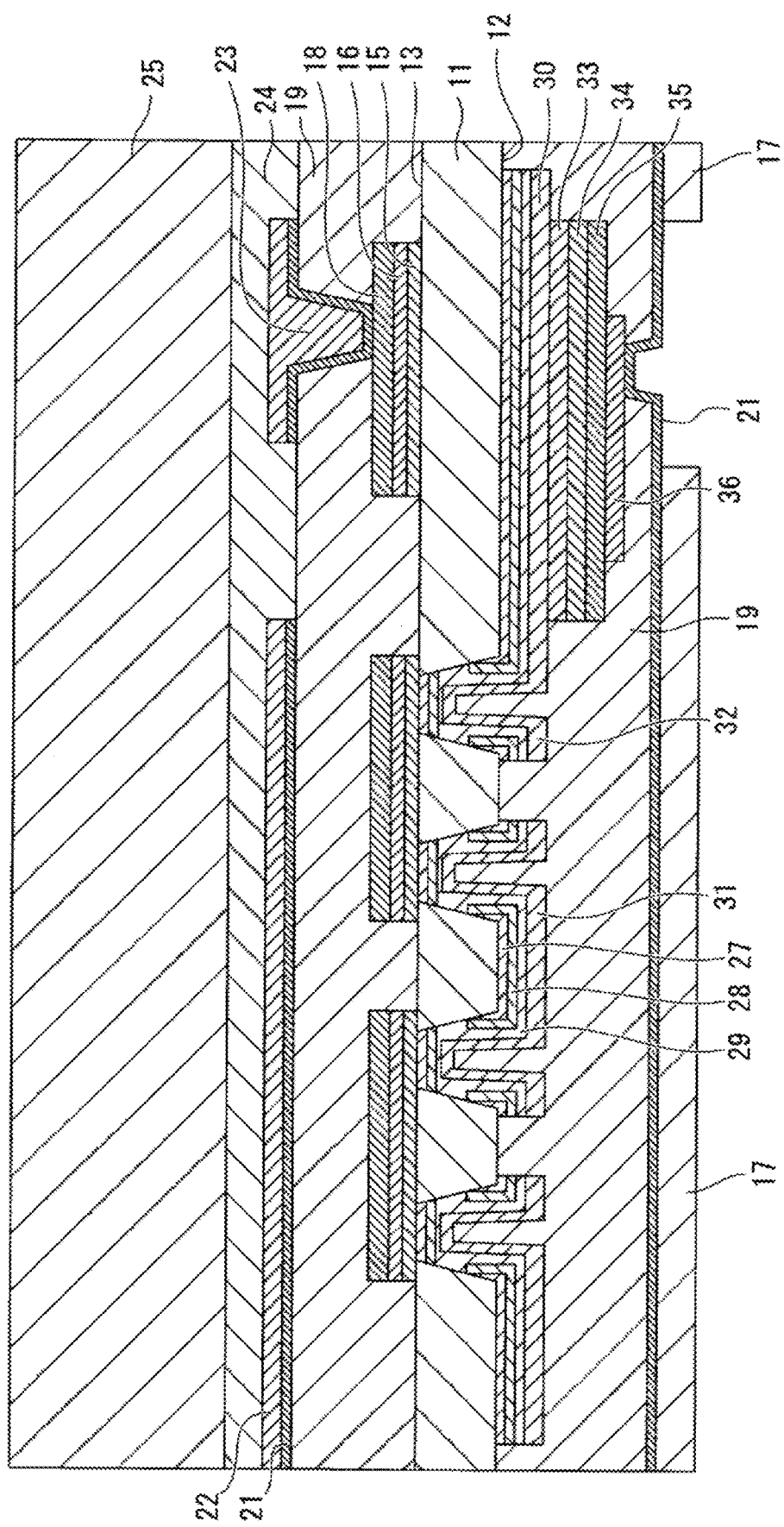
FIG. 36 is a view illustrating the production process of the circuit board according to the embodiment of the present invention.

Subsequently, as shown in FIG. 36, the photoresist 17 was used to form a pattern on the resin layer laminated on the first surface of the glass core so that only the sections intended to be the wiring layer are exposed.

Figure 37:
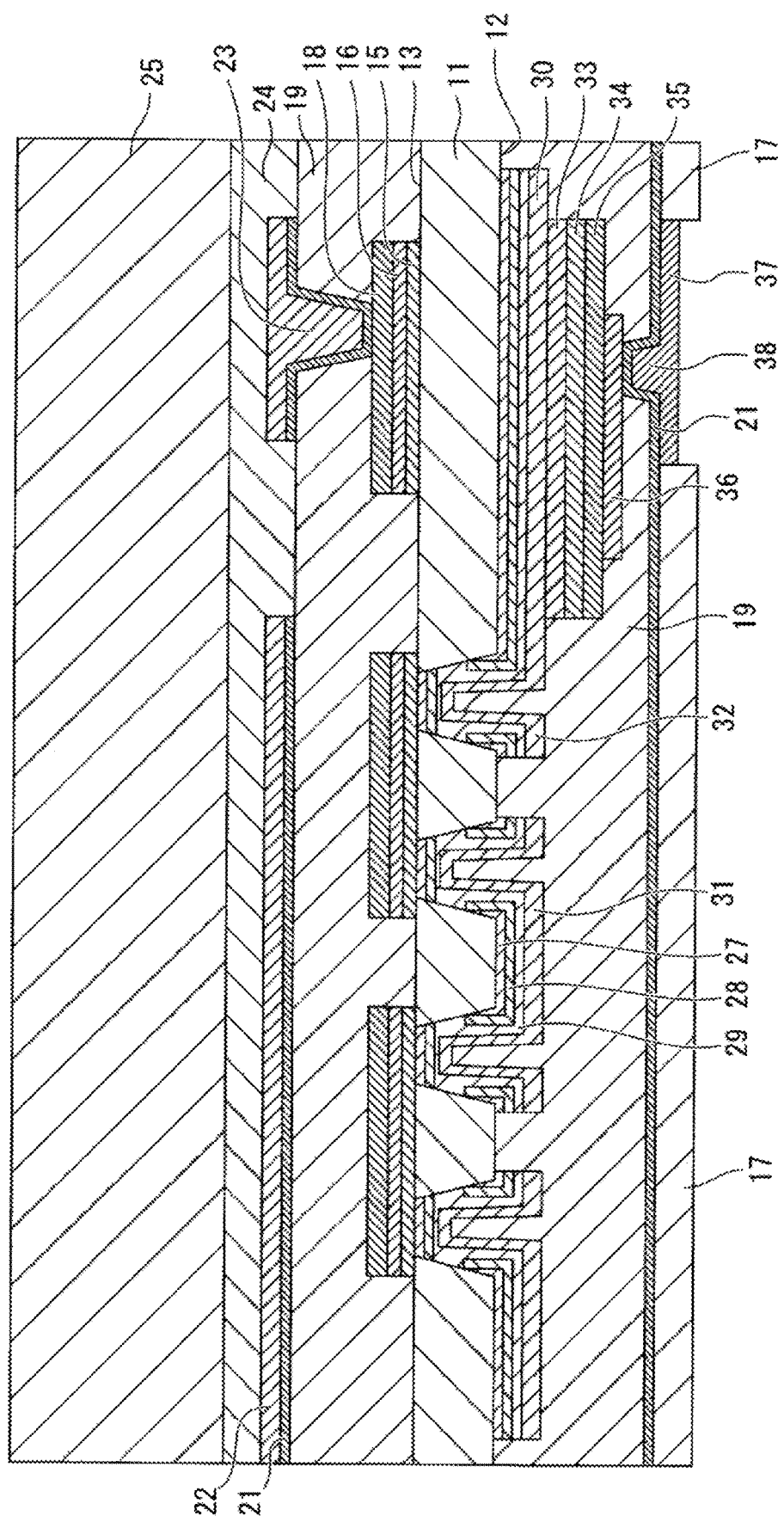
FIG. 37 is a view illustrating the production process of the circuit board according to the embodiment of the present invention.
Figure 38:
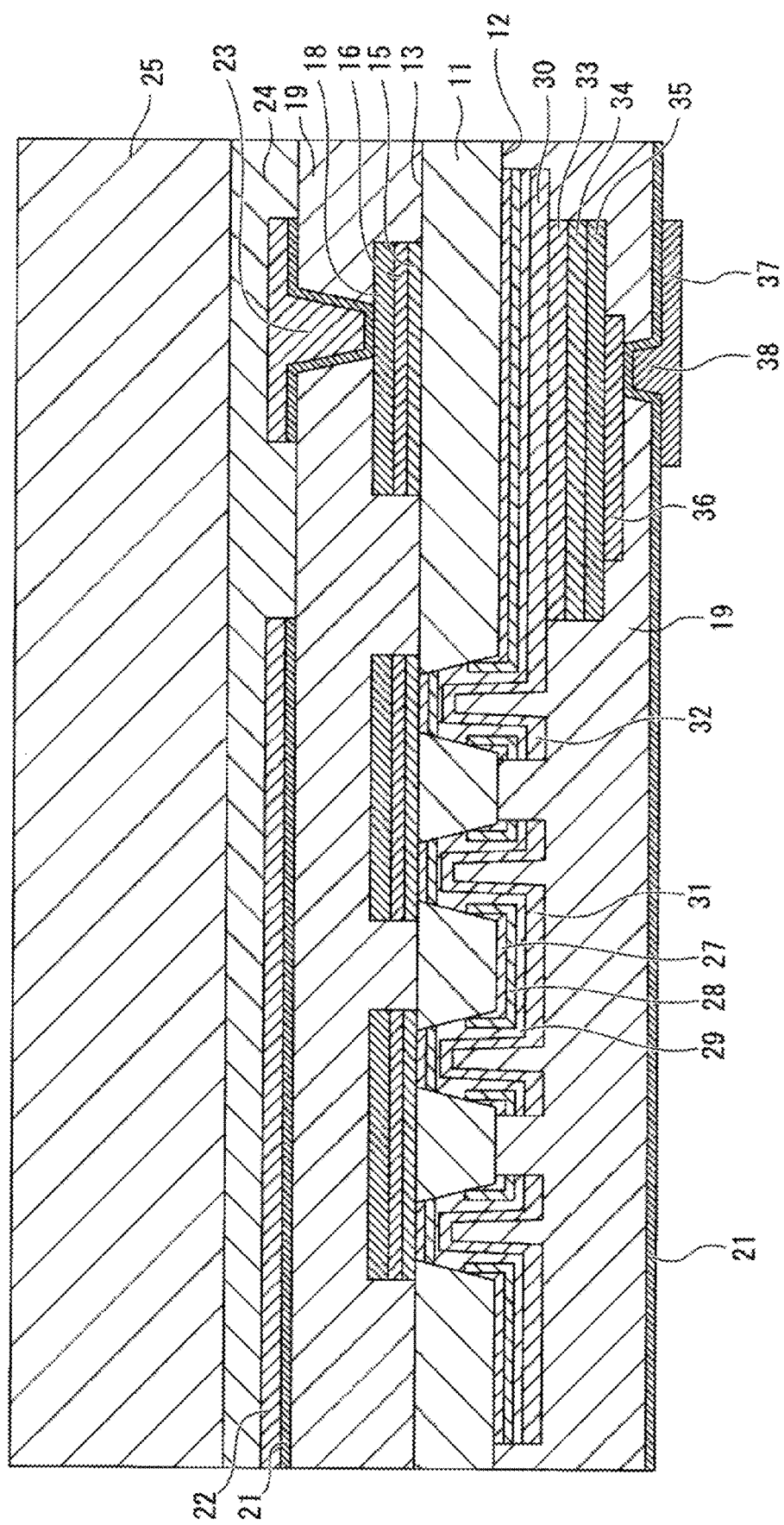
FIG. 38 is a view illustrating the production process of the circuit board according to the embodiment of the present invention.

Next, as shown in FIG. 37, electrolytic copper plating was performed on the section exposed from the photoresist pattern by electrolytic plating. The thickness of the copper 37 was set to 12 µm. The thickness of the copper and the lamination method are not limited thereto and may be selected as required depending on the purpose. After that, as shown in FIG. 38, the photoresist 17 used to form the photoresist pattern was stripped and removed.

Figure 39:
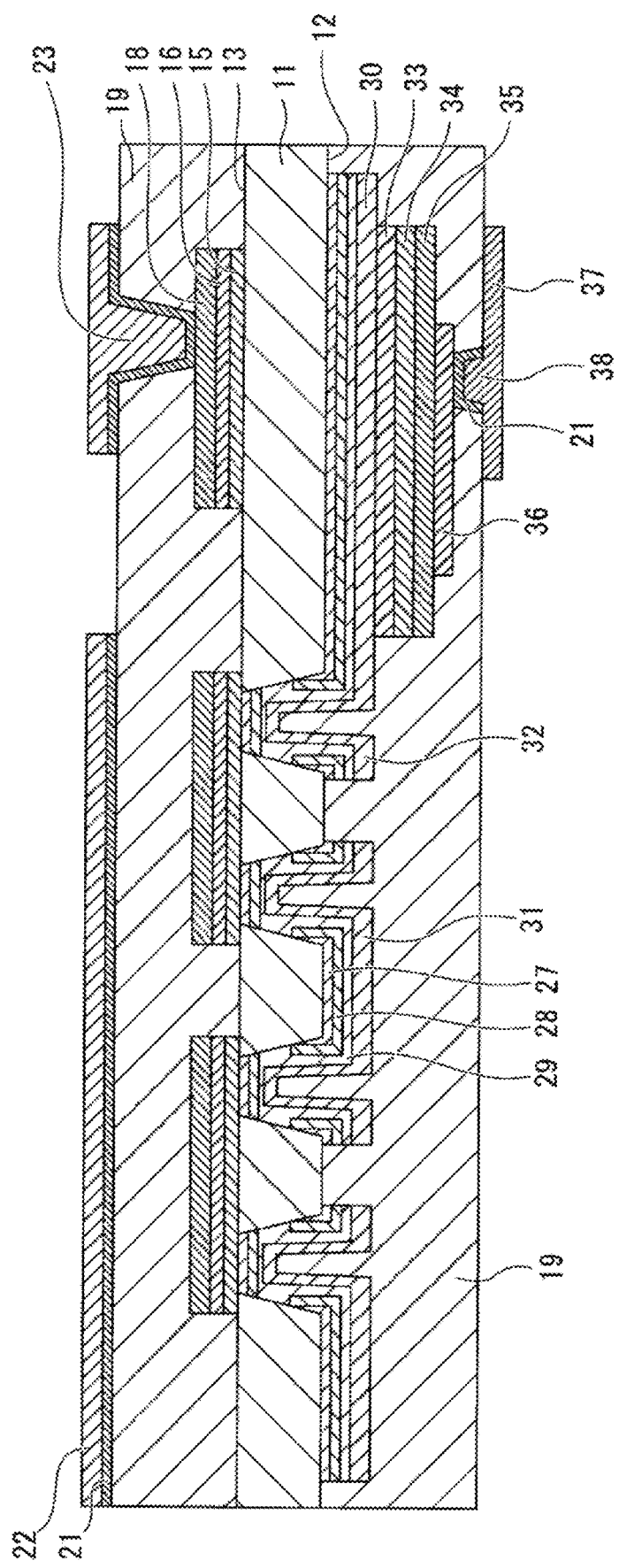
FIG. 39 is a view illustrating the producing process of the circuit board according to the embodiment of the present invention.

Subsequently, as shown in FIG. 39, the carrier glass 25, which was adhered to the first surface of the glass core, was removed. In the case of the example, the carrier glass was removed by a mechanical method, but is not limited thereto, and a method suitable for the purpose may be selected as required. In this manner, a glass core multilayer substrate was completed.

Note that, in the example, the layer structure of the multilayer substrate includes the wiring layers directly provided on the front and rear surfaces of the glass core, the insulation layers provided on both surfaces of the glass core, and the wiring layers provided on the insulation layers. However, an insulation layer and wiring may further be laminated on this layer structure as required.

[Reference Signs List] 11 . . . Glass core; 12 . . . First surface of glass core; 13 . . . Second surface of glass core; 14 . . . Weakened portion in glass core; 15 . . . Hydrofluoric acid resistant layer; 16 . . . Copper layer on hydrofluoric acid resistant layer formed by sputtering; 17 . . . Photoresist; 18 . . . Copper wiring layer on second surface of glass core; 19 . . . Insulating resin layer; 20 . . . Via provided in insulating resin layer; 21 . . . Copper layer; 22 . . . Copper wiring layer on insulating resin layer laminated on second surface of glass core; 23 . . . Through electrode in insulating resin layer laminated on second surface of glass core; 24 . . . Adhesive layer; 25 . . . Carrier glass; 26 . . . Via in glass core; 27 . . . Sputtered titanium layer (a component of first layer of through electrode); 28 . . . Sputtered copper layer (a component of first layer of through electrode); 29 . . . Electroless nickel layer (second layer of through electrode); 30 . . . Capacitor lower electrode; 31 . . . Copper wiring layer on first surface of glass core

32 . . . Electrolytic copper layer (third layer of through electrode); 33 . . . Dielectric layer; 34 . . . Sputtered titanium layer on dielectric layer; 35 . . . Sputtered copper layer on sputtered titanium layer on dielectric layer; 36 . . . Capacitor upper electrode; 37 . . . Copper wiring layer on insulating resin layer laminated on first surface of glass core; 38 . . . Through electrode in insulating resin layer laminated on first surface of glass core; 39 . . . Through electrode in glass core.

What is claimed is:

1. A glass core multilayer wiring board, comprising:
   a glass substrate including a first surface, a second surface facing away from the first surface, and a through hole having a diameter which decreases from the first surface toward the second surface;
   a through electrode located along a side wall of the through hole; and
   a first layer structure formed on the first surface of the glass substrate and a second layer structure formed on the second surface of the glass substrate, wherein
   the second layer structure is formed to close an opening of the through hole in the second surface to define a bottom section of the through hole, and wherein
   the through electrode includes three layers,
      a first layer of the three layers being located on part of the side wall of the through hole closer to the first surface and on part or all of the bottom section of the through hole in the second surface closing the opening of the through hole in the second surface,
      a second layer of the three layers being located to cover the first layer, the side wall of the through hole exposed from the first layer, and the bottom section of the through hole in the second surface, and
      a third layer of the three layers being located on the second layer.

2. The glass core multilayer wiring board of claim 1, wherein a conductive material constituting the first layer structure and the second layer structure includes metal, the metal including nickel, chromium, or an alloy thereof.

3. The glass core multilayer wiring board of claim 1, wherein at least one of the three layers comprises a plurality of layers.

4. The glass core multilayer wiring board of claim 1, wherein the first layer structure includes a first wiring layer, formed of a conductor, located on the first surface, the second layer structure including a second wiring layer, formed of the conductor, being located on the second surface, respective insulation layers and respective conductive wiring layers being alternately laminated on each of the first wiring layer and the second wiring layer.

5. The glass core multilayer wiring board of claim 4, characterized by a through electrode including a hole and conductive material located inside the hole, the hole penetrating the respective insulation layers, wherein the through electrode electrically connects the first wiring layer located on the first surface and the second wiring layer located on the second surface.

6. The glass core multilayer wiring board of claim 5, further comprising an inductor formed of a solenoid coil that is spirally wound around a glass core by connecting the through electrode, the first wiring layer on the first surface, and the second wiring layer on the second surface.

7. The glass core multilayer wiring board of claim 5, further comprising a capacitor formed by placing a first electrode in the respective conductive wiring layers, and a second electrode that is parallel to the first electrode to sandwich respective dielectric layers in between, and the capacitor is located inside the first layer structure and the second layer structure.

8. The glass core multilayer wiring board of claim 5, further comprising:
   an inductor formed of a solenoid coil that is spirally wound around a glass core by connecting the through electrode and wirings located on each of the first surface and the second surface; and
   a capacitor formed by placing a first electrode in the respective conductive wiring layers and a second electrode that forms a pair with the first electrode to sandwich a dielectric layer in between, and the capacitor is located inside the first layer structure and the second layer structure, wherein
   the inductor and the capacitor are connected in a pair or a plurality of pairs to form a frequency filter, and the frequency filter is located inside the first layer structure and the second layer structure.

9. A method for producing the glass core multilayer wiring board of claim 1, wherein the first layer is formed by sputtering.

10. A method for producing the glass core multilayer wiring board of claim 1, wherein the second layer is formed by electroless plating.

11. A method for producing the glass core multilayer wiring board of claim 1, wherein the third layer is formed by electrolytic plating.

12. A method for producing the glass core multilayer wiring board of claim 1, further comprising placing a first wiring layer formed of a conductor on the first surface and a second wiring layer formed of the conductor on the second surface, and laminating respective insulation layers and respective conductive wiring layers alternately on each of the first wiring layer and the second wiring layer.

13. The method for producing the glass core multilayer wiring board of claim 12, further comprising forming a hole that penetrates the respective insulation layers and placing conductive material inside the hole to form a through electrode, wherein the through electrode electrically connects the respective conductive wiring layers.

14. The method for producing the glass core multilayer wiring board of claim 13, further comprising connecting the through electrode to a first wiring layer located on the first surface and a second wiring layer located on the second surface, so that an inductor including a solenoid coil that is spirally wound around the glass core is located inside the first layer structure and the second layer structure.

15. The method for producing the glass core multilayer wiring board of claim 13, further comprising placing a first electrode in the respective conductive wiring layers and a second electrode that is parallel to the first electrode to sandwich a dielectric layer in between to form a capacitor, and the capacitor is located inside a first layer structure and a second layer structure.

16. The method for producing the glass core multilayer wiring board of claim 13, further comprising:
- connecting the through electrode and a first wiring located on the first surface and a second wiring located on the second surface, so that an inductor including a solenoid coil that is spirally wound around a glass core is located inside the first layer structure and the second layer structure;
- placing a first electrode in the respective conductive wiring layers and a second electrode that is parallel to the first electrode to sandwich a dielectric layer in between to form a capacitor, and the capacitor is located inside a first layer structure and a second layer structure; and
- appropriately connecting the inductor and the capacitor in a pair or a plurality of pairs to form a frequency filter, and the frequency filter is located inside the glass core multilayer wiring board.

\* \* \* \* \*